United States Patent
Shinohara

(10) Patent No.: US 11,217,682 B2
(45) Date of Patent: Jan. 4, 2022

(54) METHOD FOR MANUFACTURING SEMICONDUCTOR DEVICE HAVING THINNED FINS

(71) Applicant: RENESAS ELECTRONICS CORPORATION, Tokyo (JP)

(72) Inventor: Masaaki Shinohara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/707,985

(22) Filed: Dec. 9, 2019

(65) Prior Publication Data

US 2020/0111898 A1     Apr. 9, 2020

Related U.S. Application Data

(62) Division of application No. 15/409,947, filed on Jan. 19, 2017, now Pat. No. 10,546,946.

(30) Foreign Application Priority Data

Feb. 24, 2016    (JP) .................................. 2016-033597

(51) Int. Cl.
*H01L 29/66*      (2006.01)
*H01L 27/11531*    (2017.01)
(Continued)

(52) U.S. Cl.
CPC .................. *H01L 29/66795* (2013.01); *H01L 21/823431* (2013.01); *H01L 27/11531* (2013.01);
(Continued)

(58) Field of Classification Search
CPC ... H01L 21/02642; H01L 21/027–0338; H01L 21/0465; H01L 21/266;
(Continued)

(56) References Cited

U.S. PATENT DOCUMENTS

| 7,504,689 B2 | 3/2009 | Hisamoto et al. |
| 8,617,974 B2 | 12/2013 | Ishii et al. |

(Continued)

FOREIGN PATENT DOCUMENTS

| CN | 103137621 A | 6/2013 |
| CN | 103325736 A | 9/2013 |

(Continued)

OTHER PUBLICATIONS

Japanese Notification of Reasons for Refusal issued in corresponding Japanese Patent Application No. 2016-033597, dated Jun. 18, 2019, with English Translation.

(Continued)

*Primary Examiner* — Laura M Menz
*Assistant Examiner* — Candice Chan
(74) *Attorney, Agent, or Firm* — McDermott Will & Emery LLP

(57) ABSTRACT

Provided is a stable manufacturing method for a semiconductor device. In the manufacturing method for a semiconductor device, first, fins with an equal width are formed in each of a memory cell portion and a logic portion of a semiconductor substrate. Then, the fins in the logic portion are etched with the fins in the memory cell covered with a mask film, thereby fabricating fins in the logic portion, each of which is narrower than the fin formed in the memory cell portion.

5 Claims, 25 Drawing Sheets

(51) Int. Cl.
    *H01L 29/423*     (2006.01)
    *H01L 29/78*     (2006.01)
    *H01L 21/8234*     (2006.01)
    *H01L 21/308*     (2006.01)

(52) U.S. Cl.
    CPC ...... *H01L 29/42328* (2013.01); *H01L 29/785* (2013.01); *H01L 29/7848* (2013.01); *H01L 21/3086* (2013.01); *H01L 29/66545* (2013.01); *H01L 29/66818* (2013.01)

(58) Field of Classification Search
    CPC ... H01L 21/308–3088; H01L 21/31056; H01L 21/31144; H01L 21/32; H01L 21/32139; H01L 21/426; H01L 21/467; H01L 21/469–47576; H01L 21/7688; H01L 21/033–0338; H01L 21/823431; H01L 21/823821; H01L 21/845; H01L 27/0886; H01L 27/0924; H01L 27/10826; H01L 27/108

See application file for complete search history.

(56) References Cited

U.S. PATENT DOCUMENTS

| | | | |
|---|---|---|---|
| 8,987,100 | B2 | 3/2015 | Oh et al. |
| 9,123,659 | B1 | 9/2015 | Fu et al. |
| 9,490,177 | B2 | 11/2016 | Oh et al. |
| 2004/0150029 | A1 | 8/2004 | Lee |
| 2007/0148837 | A1 | 6/2007 | Shah et al. |
| 2013/0134520 | A1 | 5/2013 | Maeda et al. |
| 2013/0244392 | A1 | 9/2013 | Oh et al. |
| 2013/0270652 | A1 | 10/2013 | Liaw |
| 2013/0330889 | A1 | 12/2013 | Yin et al. |
| 2016/0247685 | A1 | 8/2016 | Chen et al. |
| 2017/0140992 | A1 | 5/2017 | Chang et al. |

FOREIGN PATENT DOCUMENTS

| | | |
|---|---|---|
| CN | 103474397 A | 12/2013 |
| JP | 2006-41354 A | 2/2006 |
| JP | 2013-98192 A | 5/2013 |
| JP | 2013-197589 A | 9/2013 |
| JP | 2013-229597 A | 11/2013 |

OTHER PUBLICATIONS

U.S. PTO Notice of Allowance issued in related parent U.S. Appl. No. 15/409,947, dated Sep. 11, 2019.
U S. PTO Non-Final Office Action issued in related parent U.S. Appl. No. 15/409,947, dated Feb. 26, 2019.
U.S. PTO Final Office Action issued in related parent U.S. Appl. No. 15/409,947, dated Sep. 10, 2018.
U.S. PTO Non-Final Office Action issued in related parent U.S. Appl. No. 15/409,947, dated Jan. 30, 2018.
Parent U.S. Appl. No. 15/409,947, filed Jan. 19, 2017.
Chinese Office Action issued in corresponding Chinese Patent Application No. 201710086452.X, dated Apr. 27, 2021, with English translation.

METHOD FOR MANUFACTURING SEMICONDUCTOR DEVICE HAVING THINNED FINS

CROSS-REFERENCE TO RELATED APPLICATIONS

This application is a Divisional of U.S. patent application Ser. No. 15/409,947, filed on Jan. 19, 2017, which claims the benefit of Japanese Patent Application No. 2016-033597 filed on Feb. 24, 2016 including the specification, drawings, and abstract is incorporated herein by reference in its entirety.

BACKGROUND

The present invention relates to a method for manufacturing a semiconductor device, and more particularly, to a technique suitable for use in a method for manufacturing a semiconductor device, for example, a non-volatile memory.

An Electrically Erasable and Programmable Read-Only Memory (EEPROM) is widely used as a non-volatile semiconductor storage device that can be electrically written and erased. Such a storage device, typified by a flash memory widely used at present, includes a conductive floating gate electrode or trap insulating film enclosed by an oxide film and located under a gate electrode of a Metal-Insulator-Semiconductor Field-Effect Transistor (MISFET) The storage device stores a charge stored state in the floating gate or trap insulating film as storage information, which can be read therefrom as a threshold for a transistor. The trap insulating film is an insulating film capable of storing charges therein, and is made of a silicon nitride film by way of example. The injection and release of charges into such a charge storage region shifts the threshold of the MISFET, causing the storage device, such as the flash memory, to act as a storage element. This type of flash memory is, for example, a split gate cell using a Metal-Oxide-Nitride-Oxide-Semiconductor (MONOS) film. Such a memory uses the silicon nitride film in the charge storage region to discretely store charges therein, compared to when using a conductive floating gate film, thereby achieving excellent reliability of data retention. Furthermore, this memory has the excellent reliability of data retention, and thus has various advantages that oxide films positioned above and below the silicon nitride film can be thinned, enabling writing and erasing operations at lower voltages.

The memory cell includes: a control gate electrode (select gate electrode) formed over a semiconductor substrate via a first gate insulating film; a memory gate electrode formed over the semiconductor substrate via a second gate insulating film containing the charge storage region; and a pair of semiconductor regions (source region and drain region) formed at the surface of the semiconductor substrate to sandwich therebetween the control gate electrode and the memory gate electrode.

Japanese Unexamined Patent Application Publication No. 2006-41354 (Patent Document 1) discloses a memory cell in which a control gate electrode and a memory gate electrode are arranged to stride across a convex active region formed at the surface of the semiconductor substrate.

Japanese Unexamined Patent Application Publication No. 2013-98192 (Patent Document 2) discloses a technique that uses isotropic etching to shorten the length of a sidewall as described in paragraphs [0128] to [0135] with reference to FIGS. 39 to 41.

Patent Document 1: Japanese Unexamined Patent Application Publication No. 2006-41354
Patent Document 2: Japanese Unexamined Patent Application Publication No. 2013-98192

SUMMARY

Patent Document 1 describes an invention that relates to a fin-type non-volatile memory. A sixth embodiment discloses an example in which the memory gate electrode only in the memory cell has a convex shape (fin shape), and the control gate electrode and a logic portion are formed as normal flat devices.

However, to reduce the areas and power consumption of not only a memory cell portion, but also a logic portion, MISFETs in both the memory cell portion and the logic portion need to be or a fin-type.

It is desired to develop a stable process for forming a semiconductor device with a non-volatile memory that includes fin-type MISFETs in a memory cell portion and a logic portion.

Other problems and new features of the present invention will be clearly understood by the following detailed description with reference to the accompanying drawings.

According to one embodiment, a method for manufacturing a semiconductor device is provided which includes the steps of: providing a semiconductor substrate with a main surface; forming a first mask film in each of a first region and a second region of the main surface of the semiconductor substrate; and forming a second mask film over sidewalls of the first mask film in each of the first region and the second region. The method further includes the steps of: after removing the first mask film, forming a first convex portion under the second mask film by providing concave portions through etching of parts of the semiconductor substrate located outside the second mask films in the first and second regions, the first convex portion having a first width; and forming a second convex portion in the second region by etching the first convex portion in the second region while covering the first convex portion in the first region with a third mask film, the second convex portion in the second region having a second width. The second width is narrower than the first width.

Accordingly, the one embodiment of the present invention can provide a stable manufacturing method for a semiconductor device.

DETAILED DESCRIPTION

Figure 1:
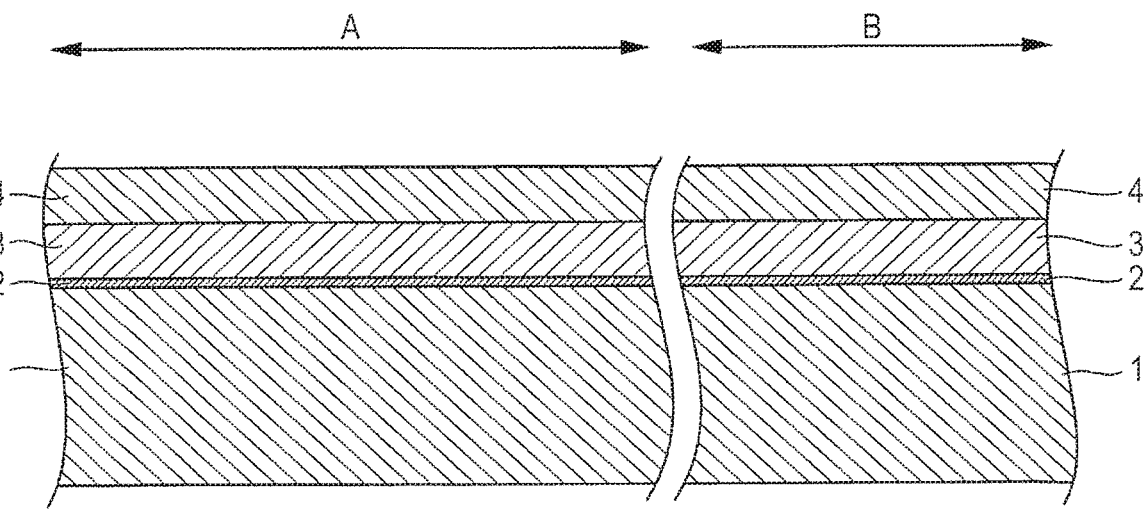
FIG. 1 is a cross-sectional view of a main part of a manufacturing step in a manufacturing method for a semiconductor device in a considered example.

The following preferred embodiments of the invention may be described below by being divided into a plurality of sections or embodiments for convenience, if necessary, which are not independent from each other unless otherwise specified. One of the sections or embodiments may be a modified example, a detailed description, supplementary explanation, and the like of a part or all of the other. Even when referring to a specific number regarding an element and the like (including the number of elements, a numerical value, an amount, a range, and the like) in the embodiments below, the invention is not limited to the specific number. The invention may take the number greater than, or less than the specific number, unless otherwise specified, and except when obviously limited to the specific number in principle. The components (including steps) in the embodiments below are not necessarily essential unless otherwise specified and except when clearly considered to be essential in principle. Likewise, when referring to the shape of one component or the positional relationship between the components in the following embodiments and the like, any shape or positional relationship substantially similar or approximate to that described herein may be included in the invention unless otherwise specified and except when clearly considered not to be so in principle. The same goes for the above numerical value and the range.

Some embodiments of the present invention will be described in detail below based on the accompanying drawings. In all drawings for explaining the embodiments, parts having the same function are indicated by the same or similar reference characters, and the repeated description thereof will be omitted. In the embodiments below, the description of the same or similar parts will not be repeated in principle, except when needed.

In the accompanying drawings used in the embodiments, even some cross-sectional views may omit hatching for easy understanding. Furthermore, some plan views are provided with hatching to make them more easily understood.

EMBODIMENTS

Considered Example

The inventors have studied and considered semiconductor devices with a plurality of fin-type MISFETs arranged in a memory cell portion with a non-volatile memory and a logic portion. First, a description will be given on a formation method for a fin-type element formation region (active region), which is part of a formation method for a semiconductor device. The fin-type element formation region (active region) will be simply called a "fin" or a "convex portion". As will be described later, a semiconductor device having a non-volatile memory considered by the inventors of the present application is required to have a structure including a memory cell portion with a wide fin width and a logic portion with a narrow fin width. That is, the fin width of the logic portion needs to be narrower than that of the memory cell portion. FIGS. 1 to 9 are cross-sectional views of main parts of formation steps in a manufacturing method for a semiconductor device in a considered example, particularly showing a fin formation step.

As shown in FIG. 1, a provision step for a semiconductor substrate (step S1) and an insulating-film formation step (step S2) are performed. In the provision step for the semiconductor substrate (step S1), a semiconductor substrate 1 made of p-type monocrystalline silicon and having, for example, a specific resistance of approximately 1 to 10 Ωcm is provided. The semiconductor substrate 1 is a semiconductor wafer having a diameter of 200 mm to 300 mm. The main surface of the semiconductor substrate 1 has a memory cell portion A and a logic portion B. A plurality of MISFETs is formed in each of the memory cell portion A and the logic portion B. The insulating-film formation step (step S2) includes a step of forming an insulating film 2 over a surface of the semiconductor substrate 1, and a step of forming an insulating film 3 over the insulating film 2. The insulating film 2 is made of a silicon oxide film with a thickness of approximately 2 to 10 nm, and the insulating film 3 is made of a silicon nitride film with a thickness of approximately 20 to 100 nm. Furthermore, as shown in FIG. 1, a mask film 4 is formed over the insulating film 3 to carry out a deposition step of the mask film 4. The mask film 4 is, for example, made of an amorphous silicon film having a thickness of 20 to 200 nm.

Figure 2:
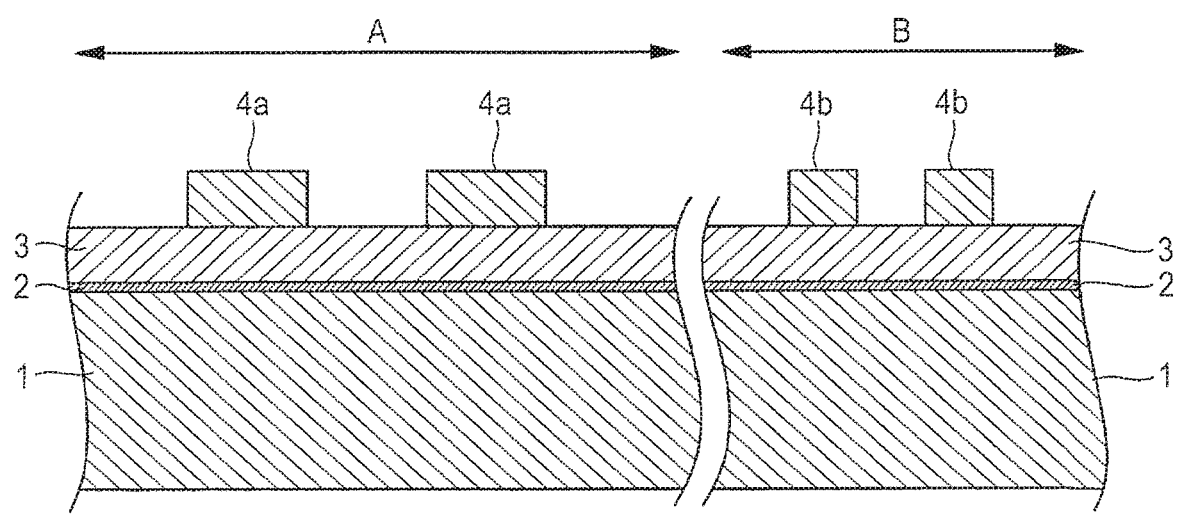
FIG. 2 is a cross-sectional view of a main part in another manufacturing step for the semiconductor device, following the step shown in FIG. 1.

Then, as shown in FIG. 2, a patterning step of the mask film 4 is carried out. The mask film 4 is patterned by using the photolithography and etching techniques, thereby forming a plurality of mask films 4a in the memory cell portion A as well as a plurality of mask films 4b in the logic portion B. The deposition step of the mask film 4 shown in FIG. 1 and the patterning step of the mask film 4 are collectively referred to as a mask-film formation step (step S3). The formation positions of fins (spacing between adjacent fins) can be determined by the widths of the mask film 4a and 4b, a spacing between the mask films 4a, and a spacing between the mask films 4b. The width of the mask film 4b and the spacing between the adjacent mask films 4b are set narrower, compared to the mask film 4a.

Figure 3:
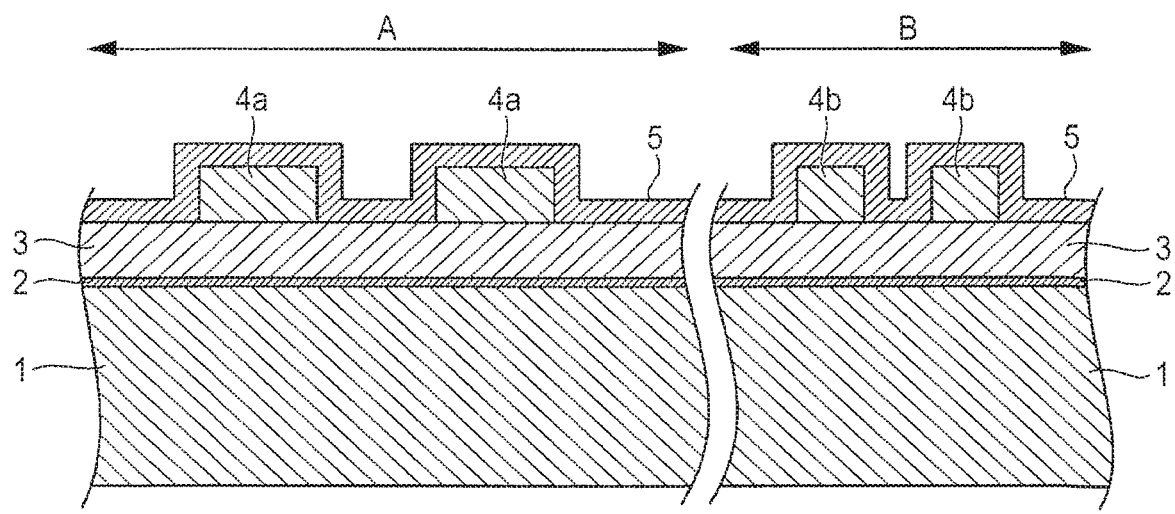
FIG. 3 is a cross-sectional view of a main part in another manufacturing step for the semiconductor device, following the step shown in FIG. 2.

Then, as shown in FIG. 3, a formation step of the insulating film 5 is carried out. The insulating film 5 is deposited over the main surface of the semiconductor substrate 1 to cover the upper surfaces and side surfaces of the mask films 4a and 4b. The insulating film 5 is made of, for example, a silicon oxide film having a thickness of 10 to 40 nm. The thickness of the insulating film 5 can determine the width of the fin.

Figure 4:
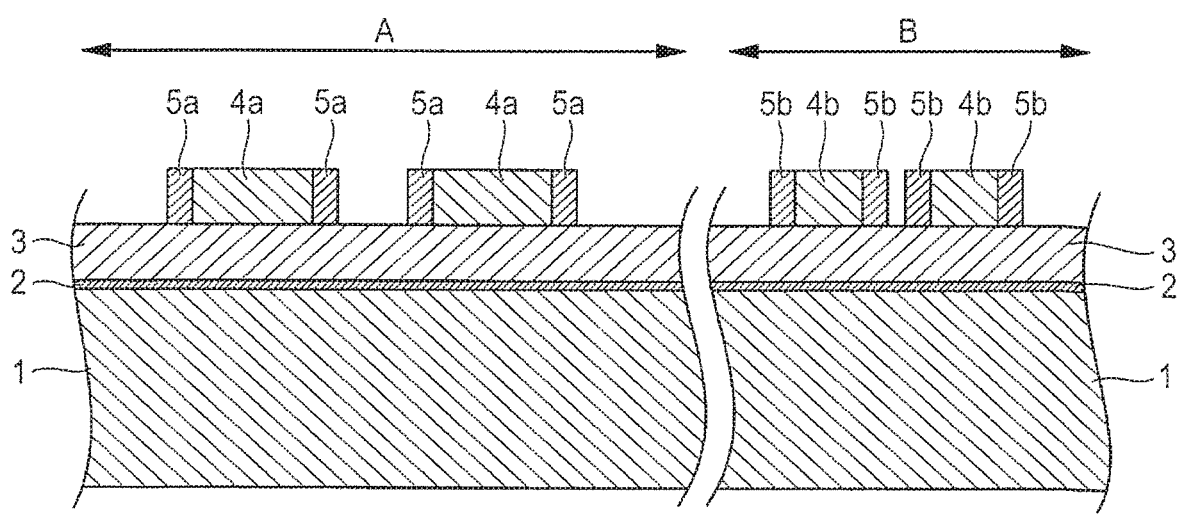
FIG. 4 is a cross-sectional view of a main part in another manufacturing step for the semiconductor device, following the step shown in FIG. 3.

Then, as shown in FIG. 4, in a formation step of hard mask films 5a and 5b, the above-mentioned insulating film 5 is subjected to anisotropic dry etching, whereby the hard mask films 5a and 5b are selectively formed of sidewall insulating films over the sidewalls of the mask films 4a and 4b. The hard mask film 5a is formed in the memory cell portion A, while the hard mask film 5b is formed in the logic portion B. The hard mask films 5a and 5b are equal in width. Furthermore, each of the hard mask films 5a and 5b has substantially the same thickness as the insulating film 5 described above. After forming the hard mask films 5a and 5b, the mask films 4a and 4b are removed.

Figure 5:
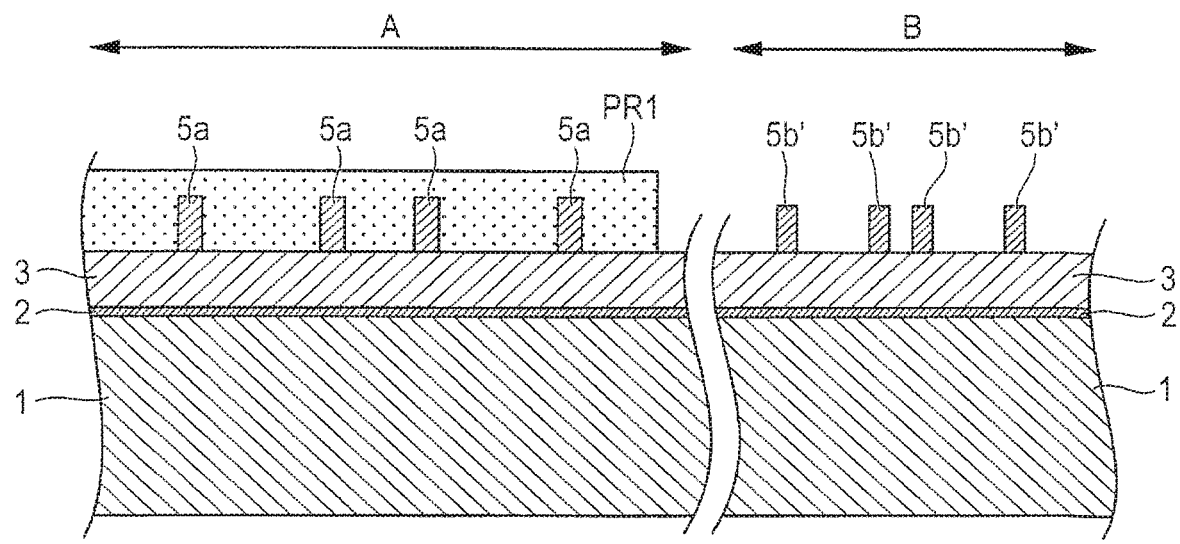
FIG. 5 is a cross-sectional view of a main part in another manufacturing step for the semiconductor device, following the step shown in FIG. 4.

Then, as shown in FIG. 5, a line-thinning step of the hard mask film 5b is carried out. A photoresist film (mask film) PR1 is formed to cover the memory cell portion A while exposing the logic portion B. Isotropic etching is applied to the hard mask films 5b in the logic portion B exposed from the photoresist film PR1. When the hard mask film is formed of a silicon oxide film, the isotropic dry etching is difficult to perform from the technical perspective, and thus wet etching is generally applied. In this way, hard mask films 5b', each having a narrower width than the above-mentioned hard mask film 5a, are formed in the logic portion B. That is, the line-thinning step is a step of decreasing (reducing) a width of the hard mask film 5b described above. After forming the hard mask films 5b', the resist film PR1 is removed. In this way, the hard mask films 5a and 5b' for formation of fins are formed in the memory cell portion A and the logic portion B, respectively. Here, the formation step of the insulating film 5, the formation step of the hard mask films 5a and 5b, and the line-thinning step of the hard mask film 5b are collectively called a "hard-mask-film formation step (step S4)".

Figure 6:
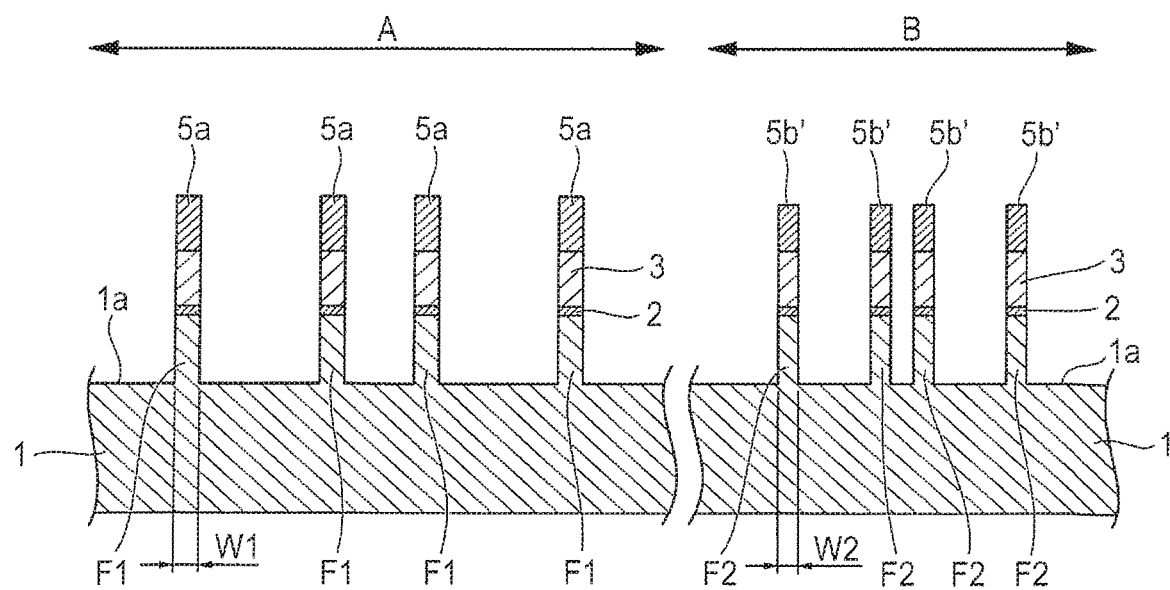
FIG. 6 is a cross-sectional view of a main part in another manufacturing step for the semiconductor device, following the step shown in FIG. 5.

Then, as shown in FIG. 6, a fin processing step (step S5) is carried out. Anisotropic dry etching is applied to the insulating films 3 and 2 and the semiconductor substrate 1 using the hard mask films 5a and 5b' as a mask, thereby producing the insulating films 3 and 2 with substantially the same shape in the planar view as the hard mask films 5a and 5b', as well as the fins F1 and F2. That is, concave portions are formed in the semiconductor substrate 1 outside each of the hard mask films 5a and 5b' (i.e., in regions not covered with the hard mask films 5a and 5b'), thereby forming the fins F1 and F2, which are convex portions enclosed by the concave portions. Here, when etching the semiconductor substrate 1, the insulating film 3 is also used as an etching mask. In this way, parts of the semiconductor substrate 1 located in regions exposed from the hard mask films 5a and 5b' are lowered by 100 to 250 nm, resulting in formation of the fins F1 and F2, each having a height of 100 to 250 am from a main surface 1a of the semiconductor substrate 1. It is apparent that a width W1 of the fin F1 in the memory cell portion A is wider than a width W2 of the fin F2 in the logic portion B.

Figure 7:
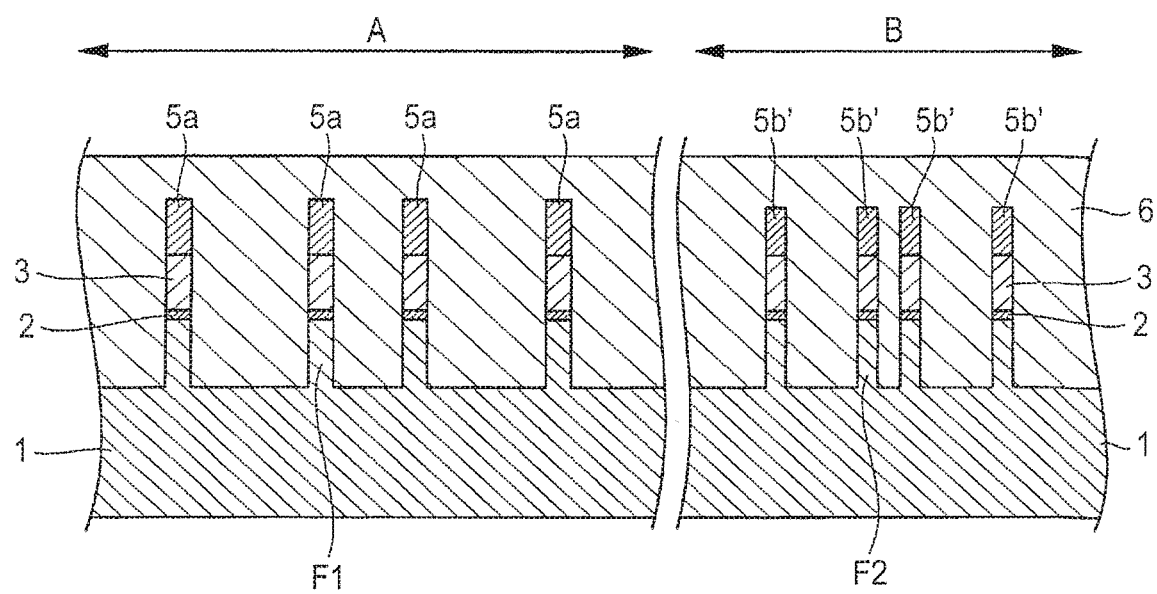
FIG. 7 is a cross-sectional view of a main part in another manufacturing step for the semiconductor device, following the step shown in FIG. 6.

Then, as shown in FIG. 7, a deposition step of an insulating film 6 is carried out. The insulating film 6 made of a silicon oxide film or the like is deposited over the semiconductor substrate 1 to completely fill the fins F1 and F2, the insulating films 2 and 3, and the hard mask films 5a and 5b'. That is, the insulating film 6 is formed in the concave portions around each convex portion.

Figure 8:
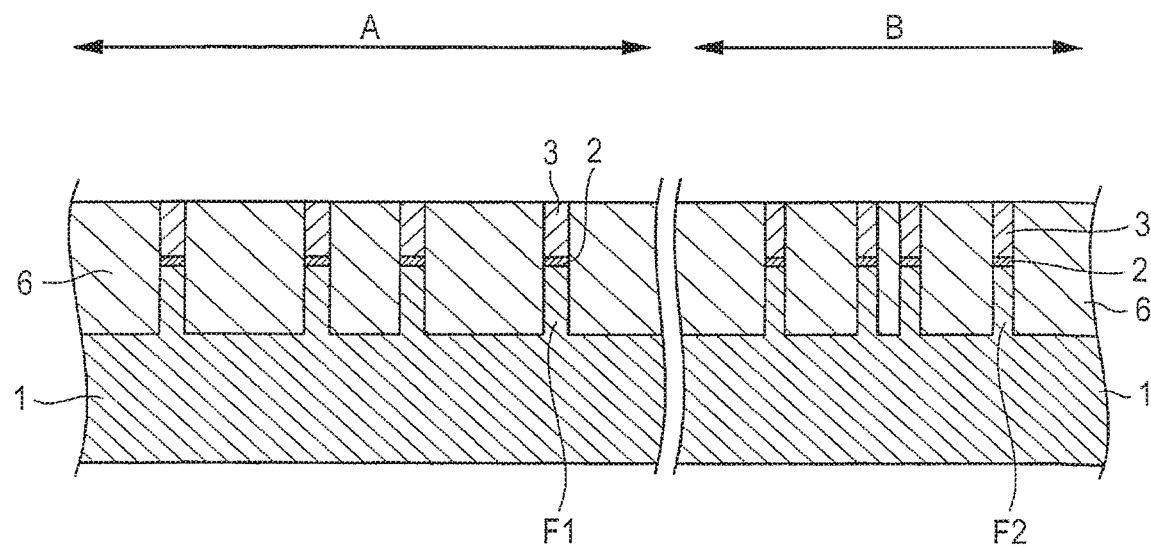
FIG. 8 is a cross-sectional view of a main part in another manufacturing step for the semiconductor device, following the step shown in FIG. 7.

Then, as shown in FIG. 8, a polishing step of the insulating film 6 is carried out. A Chemical Mechanical Polishing (CMP) process is performed on the insulating film 6, the hard mask films 5a and 5b' described above, and the insulating film 3. After polishing the hard mask films 5a and 5b', the insulating films 3 and 6 are polished until the thickness of the insulating film 3 reaches, for example, approximately 20 nm.

Figure 9:
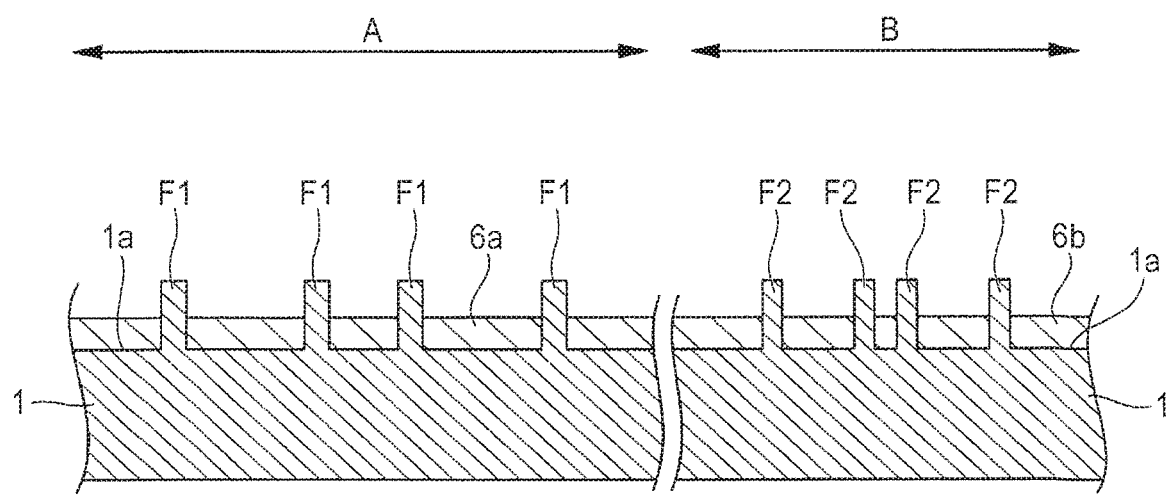
FIG. 9 is a cross-sectional view of a main part in another manufacturing step for the semiconductor device, following the step shown in FIG. 8.

Then, as shown in FIG. 9, an etch-back step of the insulating film 6 is carried out. After completion of the above-mentioned polishing step, first, the insulating film 3 is removed, for example, by wet etching. Then, the isotropic etching is applied to the insulating film 6 to thereby form element isolation films 6a and 6b. That is, the upper surface of the insulating film 6 is lowered to set the height of each of the fins F1 and F2, for example, at approximately 30 nm to 50 nm. Here, the deposition step of the insulating film 6, the polishing step of the insulating film 6, and the etch-back step of the insulating film 6 are collectively called a fin formation step (step S6). Note that in the isotropic etching step of the insulating film 6, the insulating film 2 is also removed.

Throughout the steps described above, the fins F1 can be formed in the memory cell portion A, while the fins F2 can be formed in the logic portion B. Each of the fins F1 and F2 is a convex portion that protrudes from the main surface 1a of the semiconductor substrate 1. The fins F1 and F2 are enclosed by the element isolation films 6*a* and 6*b*, respectively, formed over the main surface 1*a* of the semiconductor substrate 1. That is, the adjacent fins F1 are separated from each other by the element isolation film 6*a*, while the adjacent fins F2 are separated from each other by the element isolation film 6*b*. The fin F1 includes a non-volatile memory cell, while the fin F2 includes a MISFET, as will be described later.

Studies by the inventors show that there is some room for further improvement in the above-mentioned fin formation method.

First, in the line-thinning step of the hard mask film 5*b* in the above-mentioned hard-mask-film formation step (step S4), suppose that the hard mask film 5*b* is wet-etched with hydrofluoric acid. In such a case, the etching amount is difficult to control, resulting in large variations in the etching amount, and in the size (width, length, or height) of the hard mask film 5*b*' on the plane of a semiconductor wafer. Variations in the etching amount and in the size of the hard mask film 5*b*' directly lead to variations in the width of the fin, which causes variations in the characteristics of the MISFETs formed thereat.

Secondly, in the formation process of the insulating film 5 in the above-mentioned hard-mask-film formation step (step S4), the thickness of the insulating film 5 is set to the width of the hard mask film 5*a* in the memory cell portion A, which is larger than the width of the hard mask film 5*b*' in the logic portion B. For this reason, in a stage where the insulating film 5 is deposited, an interval between the adjacent mask films 4*b* in the logic portion B is filled with the insulating film 5. Even the anisotropic dry etching on the insulating film 5 in the formation step of the hard mask films 5*a* and 5*b* fails to form the hard mask film 5*b*, which appears to be a problem. In particular, the miniaturization of the MISFET formed in the logic portion B is found to make this type of problem worse.

<Device Structure of Semiconductor Device>

Figure 10:
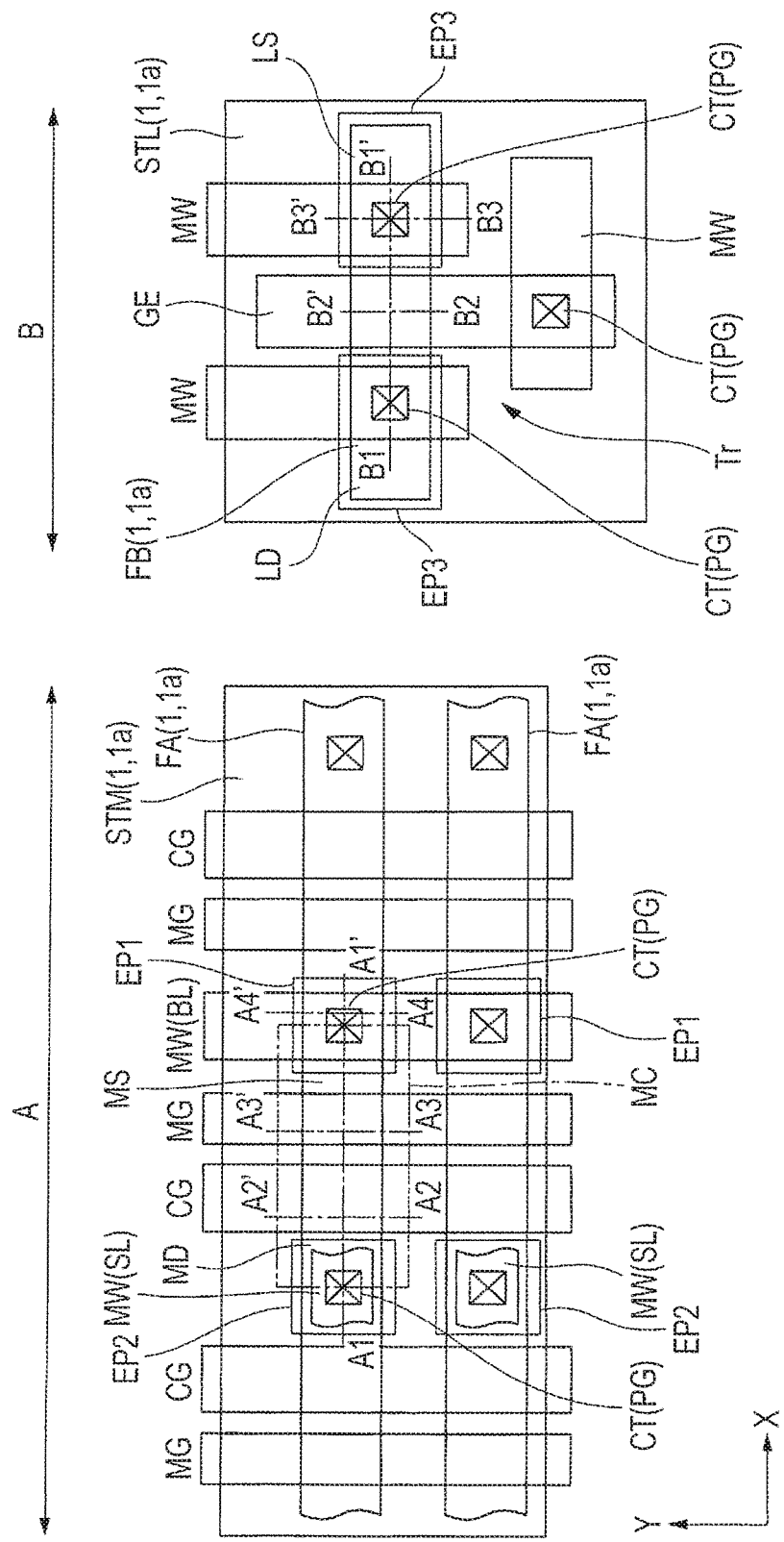
FIG. 10 is a plan view of a main part of the semiconductor device in one embodiment.
Figure 11:
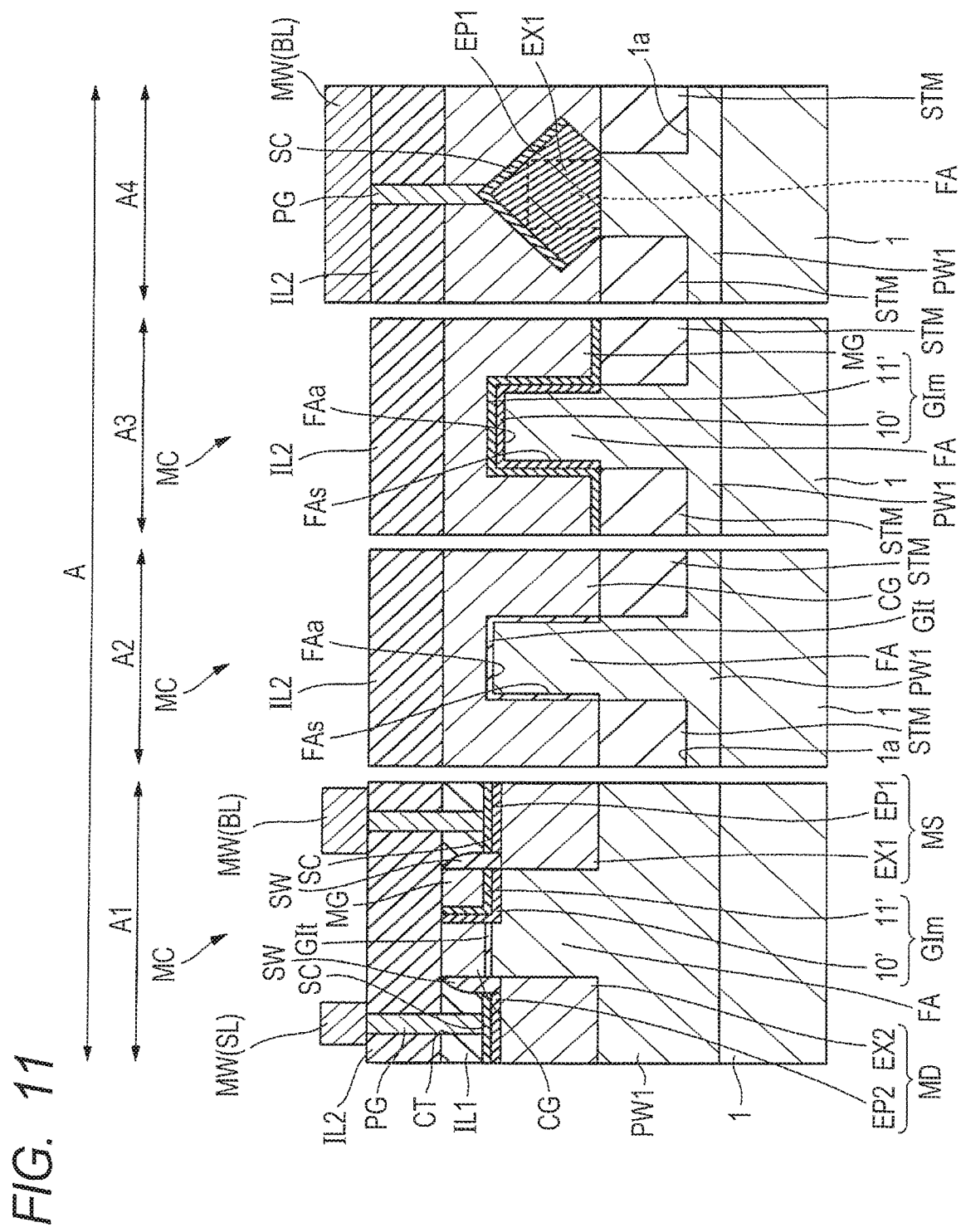
FIG. 11 is a cross-sectional view of the main part of the semiconductor device in the one embodiment.
Figure 12:
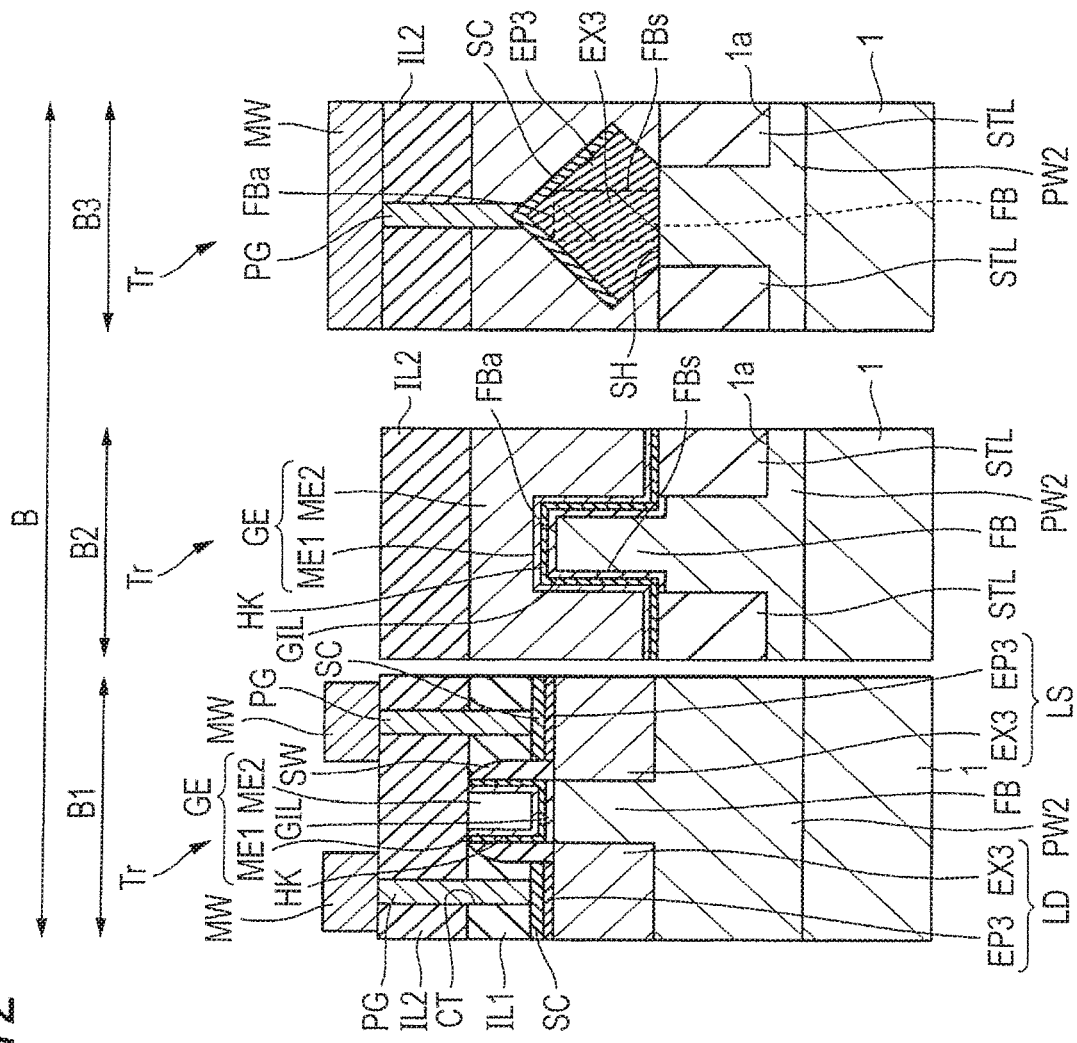
FIG. 12 is a cross-sectional view of a main part of the semiconductor device in the one embodiment.

FIG. 10 shows a plan view of a main part of the semiconductor device in this embodiment. Referring to FIG. 10, the memory cell portion A corresponds to a plan view of a main part of a memory cell array having a plurality of memory cells arranged in rows and columns, while the logic portion B corresponds to a plan view of a main part of a transistor Tr that configures a logic circuit and the like in a logic circuit formation region. While an n-type Metal Insulator Semiconductor Field Effect Transistor (MISFET) is exemplified as the transistor Tr, a p-type MISFET can also be formed in the same way. FIG. 11 shows a cross-sectional view of a main part of the memory cell portion in the semiconductor device in this embodiment. FIG. 11 illustrates four cross-sectional views of the memory cell portion A, in which a memory cell portion A1 corresponds to a cross-sectional view taken along the line A1-A1' of FIG. 10; a memory cell portion A2 to a cross-sectional view along the line A2-A2' of FIG. 10; a memory cell portion A3 to a cross-sectional view along the line A3-A3' of FIG. 10; and a memory cell portion A4 to a cross-sectional view along the line A4-A4' of FIG. 10. FIG. 12 shows three cross-sectional views of the logic portion B. A logic portion B1 corresponds to a cross-sectional view taken along the line B1-B1' of FIG. 10; a logic portion B2 to a cross-sectional view along the line B2-B2' of FIG. 10; and a logic portion B3 to a cross-sectional view along the line B3-B3' of FIG. 10.

As shown in FIG. 10, in the memory cell portion A, fins FA extending in the X direction are arranged at equal intervals in the Y direction. Each of the fins FA is, for example, a protrusion (convex portion) in a rectangular parallelepiped shape that selectively protrudes from the main surface 1*a* of the semiconductor substrate 1. Each fin FA has its lower end part enclosed by an element isolation film STM that covers the main surface 1*a* of the semiconductor substrate 1. The fins FA are parts of the semiconductor substrate 1 and serve as the active regions of the semiconductor substrate 1. Thus, in the planar view, a region between the adjacent fins FA is filled with the element isolation film STM, and each fin FA is enclosed by the element isolation film STM. The fins FA serve as the active regions for forming the memory cells MC.

On the fins FA, a plurality of control gate electrodes CG and a plurality of memory gate electrodes MG are arranged to extend in the Y direction (i.e., in the direction perpendicular to the X direction). A drain region MD is formed on the side of the control gate electrode CG, and a source region MS is formed on the side of the memory gate electrode MG in such a manner as to sandwich the control gate electrode CG and the memory gate electrode MG between these regions. The drain region MD and the source region MS are semiconductor regions with n-type impurities introduced into the fin FA. Epilayers EP2 and EP1 are formed around the fins FA. That is, the drain region MD is an n-type semiconductor region in which n-type impurities are introduced into the fin FA and the epilayer EP2. The source region MS is an n-type semiconductor region in which n-type impurities are introduced into the fin FA and the epilayer EP1. The drain region MD is formed between the adjacent two control gate electrodes CG, while the source region MS is formed between the adjacent two memory gate electrodes MG. The memory cell MC includes the control gate electrode CG, the memory gate electrode MG, the drain region MD, and the source region MS.

Either the drain region MD or the source region MS is shared between the two memory cells MC adjacent in the X direction. The two memory cells MC sharing the drain region MD are arranged mirror-symmetrically in the X direction with respect to the drain region MD, while the two memory cells MC sharing the source region MS are arranged mirror-symmetrically in the X direction with respect to the source region MS.

In each fin FA, three or more, or numerous memory cells MC are formed in the X direction. The drain regions MD of the plurality of memory cells MC arranged in the X direction are coupled to a source line SL made of a metal wiring MW extending in the X direction via plug electrodes PG formed in contact holes CT. The source regions MS of the plurality of memory cells MC arranged in the Y direction are coupled to a bit line BL made of a metal wire MW extending in the Y direction. The source line SL is preferably formed using the metal wiring located in a different layer from that of the bit line BL. For example, the source line SL is preferably configured of the metal wiring located in an upper layer relative to the bit line BL.

In the logic portion B, for example, the fins FB are formed to extend in the X direction. Each of the fins FB is an active region of the semiconductor substrate 1, like the fin FA. The lower end of the fin FB is enclosed by an element isolation film STL covering the main surface 1*a* of the semiconductor substrate 1. A gate electrode GE extending in the Y direction is disposed over the fin FB. The fin FB has a drain region LD and a source region LS formed to sandwich the gate electrode GE therebetween. The drain region LD and the source region LS are semiconductor regions with n-type impurities introduced into the fin FB. An epilayer EP3 is formed around each fin FB. That is, the drain region LD and the source region LS are n-type semiconductor regions in which n-type impurities are introduced into the fin FB and the epilayer EP3. The transistor Tr includes the gate electrode GE, the drain region LD, and the source region LS. The gate electrode GE, the drain region LD, and the source region LS are coupled to the metal wiring MW via the plug electrodes PG formed in the contact holes CT. The fins FB serve as the active regions for forming the transistor Tr.

The fins FA and FB are protrusions, for example, having a rectangular parallelepiped shape, which protrude from the main surface 1a of the semiconductor substrate 1 in the direction perpendicular to the main surface 1a. The fins FA and FB have any length in the long-side direction, any width in the short-side direction, and any height in the height direction. The fins FA and FB do not necessarily have a rectangular parallelepiped shape, and may have a rectangular sectional shape in the short-side direction with its rounded corner (or corners). In the planer view, the direction in which the fins FA and FB are extended is the long-side direction, and the direction perpendicular to the long-side direction is a short-side direction. That is, the length of the fin is larger than the width thereof. Note that the fins FA and FB are not limited to specific shapes as long as they are protrusions with a length, a width, and a height. An example of the shape of the fins FA and FB can include a meandering pattern in the planar view.

Next, the structures of the memory cell MC and the transistor Tr will be described with reference to FIGS. 11 and 12.

As shown in FIG. 11, the fins FA as the protrusions of the semiconductor substrate 1 are formed in the memory cell portion A of the semiconductor substrate 1. Each fin FA has its lower part enclosed by an element isolation film STM formed over the main surface 1a of the semiconductor substrate 1. That is, the adjacent fins FA are separated from each other by the element isolation film STM. A p-type well PW1, which is a p-type semiconductor region, is formed in a lower part of the fin FA. In other words, the fin FA is formed within the p-type well PW1.

The control gate electrode CG is formed over a main surface FAa and side surfaces FAs of the fin FA via a gate insulating film GIt. The memory gate electrode MG is formed in a region adjacent to the control gate electrode CG in the long-side direction of the fin FA via a gate insulating film GIm. The gate insulating film GIm is interposed between the control gate electrode CG and the memory gate electrode MG, so that the control gate electrode CG is electrically isolated from the memory gate electrode MG by the gate insulating film GIm. Alternatively, an insulating film other than the gate insulating film GIm may be interposed between the control gate electrode CG and the memory gate electrode MG to electrically isolate these electrodes from each other.

Here, the gate insulating film GIt is a thermally oxidized film (silicon oxide film) formed by thermally oxidizing the main surface FAa and side surfaces FAs of the fin FA, which is the protrusion (convex portion) of the semiconductor substrate 1 made of silicon. The thickness of the gate insulating film GIt is 2 nm. The gate insulating film GIm is made of an insulating film 10' and an insulating film 11' formed on the insulating film 10'. The insulating film 10' is a thermally oxidized film (silicon oxide film) of 5 to 6 nm in thickness that is formed by thermally oxidizing the main surface FAa and side surfaces FAs of the fin FA, which is the protrusion of the semiconductor substrate 1 made of silicon. The insulating film 11' is configured of a laminated film that includes a silicon nitride film serving as a charge storage portion (charge storage layer) and a silicon oxynitride film covering the surface of the silicon nitride film. The silicon nitride film has a thickness of 7 nm, and the silicon oxynitride film has a thickness of 9 nm. That is, the gate insulating film GIm has a laminated structure that includes a silicon oxide film, a silicon nitride film, and a silicon oxynitride film, the total thickness of the laminated structure being in a range of 21 to 22 nm. Thus, the gate insulating film GIm is thicker than the gate insulating film GIt under the control gate electrode CG. Alternatively, the gate insulating film GIm may have a laminated structure that includes a silicon oxide film, a silicon nitride film, and a silicon oxide film which are stacked in this order.

In the memory cell portion A2, in the short-side direction of the fin FA, the control gate electrode CG extends along the main surface FAa and side surfaces FAs of the fin FA via the gate insulating film GIt, and also extends over the element isolation film STM that encloses the fin FA. That is, the control gate electrode CG is configured to stride across the fin FA via the gate insulating film GIt. Likewise, in the memory cell portion A3, in the short-side direction of the fin FA, the memory gate electrode MG extends along the main surface FAa and side surfaces FAs of the fin FA via the gate insulating film GIm, and also extends over the element isolation film STM that encloses the fin FA. That is, the memory gate electrode MG is configured to stride across the fins FA via the gate insulating film GIm.

In the memory cell portions A1 and A4, the source region MS and the drain region MD are disposed outside the control gate electrode CG and the memory gate electrode MG to sandwich the control gate electrode CG and the memory gate electrode MG. The source region MS has an $n^-$-type semiconductor region EX1 and the epilayer EP1, while the drain region MD has an $n^-$-type semiconductor region EX2 and the epilayer EP2. The $n^-$-type semiconductor regions EX1 and EX2 are n-type semiconductor regions in which n-type impurities are introduced into the fin FA. The epilayers EP1 and EP2 are silicon epitaxial layers formed on the upper surface FAa and side surfaces FAs of the fin FA. The epilayers EP1 and EP2 have n-type impurities, such as phosphorus (P), introduced thereinto at a high concentration. The concentration of impurities in each of the epilayers EP1 and EP2 is higher than that in each of the $n^-$-type semiconductor regions EX1 and Ex2.

Over sidewalls of the control gate electrode CG and memory gate electrode MG, sidewall spacers (sidewalls, or sidewall insulating films) SW and an interlayer insulating film IL1 are formed. Furthermore, an interlayer insulating film IL2 is formed over the interlayer insulating film IL1 to cover the control gate electrode CG, the memory gate electrode MG, the source region MS, and the drain region MD. The metal wirings MW are formed on the interlayer insulating film IL2. The metal wirings MW are electrically coupled to the source region MS and the drain region MD via the plug electrodes PG provided in the contact holes CT formed in the interlayer insulating films IL2 and IL1. Note that a silicide layer SC is formed on the surface of each of the epilayers EP1 and EP2, and the plug electrode PG is in contact with the silicide layer SC.

The memory cell MC includes the control gate electrode CG, the memory gate electrode MG, the drain region MD, and the source region MS, which are formed at the fin FA. The control gate electrode CG is disposed over the main surface FAa and side surfaces FAs of the fin FA via the gate insulating film GIt. The memory gate electrode MG is disposed over the main surfaces FAa and side surfaces FAs of the fin FA via the gate insulating film GIm. The drain region MD and the source region MS are disposed to sandwich therebetween the control gate electrode CG and the memory gate electrode MG. A distance in the long-side direction between the drain region MD and the source region MS corresponds to a channel length of the memory cell MC. A region where the control gate electrode CG or memory gate electrode MG in the short-side direction faces the main surface FAa and side surfaces FAs of the fin FA corresponds to a channel width of the memory cell MC.

As shown in FIG. 12, the fins FB as the protrusions of the semiconductor substrate 1 are formed in the logic portion B of the semiconductor substrate 1. Each fin FB has its lower part enclosed by the element isolation film STL formed over the main surface 1a of the semiconductor substrate 1. That is, the adjacent fins FB are separated from each other by the element isolation film STL. A p-type well PW2, which is a p-type semiconductor region, is formed in a lower part of the fin FB. In other words, the fin FB is formed within the p-type well PW2.

In the logic portion B1, the transistor Tr includes a gate electrode GE, and a source region LS and a drain region LD arranged on both ends of the gate electrode GE, all of which are formed at the fin FB. The gate electrode GE is formed over the main surface FBa and side surfaces FBs of the fin FB via the gate insulating film GIL and the insulating film HK. The gate insulating film GIL is a thermally oxidized film and has a thickness of approximately 1 to 2 nm. In the logic portion B2, in the short-side direction of the fin FB, the gate electrode GE extends along the main surface FBa and side surfaces FBs of the fin FB via the gate insulating film GIL and the insulating film HK, and also extends over the element isolation film STL that encloses the fin FB. The gate electrode GE has a laminated structure including the metal films ME1 and ME2.

The source region LS and the drain region LD are disposed outside the gate electrode GE to sandwich the gate electrode GE therebetween. Each of the source region LS and the drain region LD has an n⁻-type semiconductor region EX3 and the epilayer EP3. The source region LS and the drain region LD are formed across the entire fin FB exposed from the element isolation film STL in the short-side direction and in the height direction. In the logic portion B3, the source region LS is configured of the fin FB and the epilayer EP3 formed over the main surface FBa and side surfaces FBs of the fin FB. The epilayer EP3 is a silicon epitaxial layer formed on the upper surface FBa and side surfaces FBs of the fin FB. The epilayer EP3 has n-type impurities, such as phosphorus (P), introduced thereinto at a high concentration. The concentration of impurities in the epilayer EP3 is higher than that in the n⁻-type semiconductor region EX3. The drain region LD also has the same structure as the source region LS.

Over sidewalls of the gate electrode GE, sidewall spacers SW and the interlayer insulating film IL1 are formed. Furthermore, the interlayer insulating film IL2 is formed over the interlayer insulating film IL1 and the gate electrode GE. The metal wirings MW are formed on the interlayer insulating film IL2. The metal wirings MW are electrically coupled to the source region LS and the drain region LD via the plug electrodes PG provided in the contact holes CT formed in the interlayer insulating films IL2 and IL1. Note that the silicide layer SC is formed on the surface of each epilayer EP3, and the plug electrode PG is in contact with the silicide layer SC.

Note that the p-type wells PW1 and PW2 are shown only in FIGS. 11 and 12, and will be omitted in cross-sectional views for other manufacturing methods.

<Manufacturing Steps for Semiconductor Device>

Now, the manufacturing steps for the semiconductor device in this embodiment will be described. First, the fin formation step will be described, and then the formation methods for the memory cell in the memory cell portion and the MISFET in the logic portion will be described below. The fin formation method in this embodiment is based on the consideration example described above, and thus only different points from the above-mentioned fin formation step will be mainly described. FIGS. 13 to 28 are cross-sectional views of main parts in the formation steps for the semiconductor device in this embodiment.

Now, a description will be given on the importance of setting the width of the fin FA in the memory cell portion A wider (larger) than that of the fin FB in the logic portion B.

As mentioned above, the insulating film 10' (of 5 to 6 nm in thickness) as the thermally oxidized film is formed on the main surface FAa and side surface FAs of the fin FA in the part covered with the memory gate electrode MG. The thickness of the insulating film 10' is preferably thicker than that of the gate insulating film GIt or the gate insulating film GIL (of 1 to 2 nm in thickness) formed of the thermally oxidized film on the main surface FBa and side surfaces FBs of the fin FB in the logic portion B. This is because the insulating film 10' located under the insulating film 11', which serves as the charge storage portion, is thickened, thereby making it possible to increase the charge retention time and the number of rewritable times of the memory cell MC.

Since the width of the fin FA in the memory cell portion A is decreased by at least approximately twice as large as the thickness of the insulating film 10', the fin FA needs to be thickened by the decrease in advance. On the other hand, the gate insulating film GIL (of 1 to 2 nm in thickness) formed of the thermally oxidized film on the main surface FBa and side surfaces FBs of the fin FB in the logic portion B is thinner than the insulating film 10'. Furthermore, the width of the fin FB in the logic portion B needs to be set as narrow as possible, bringing the substrate part of the MISFET formed there into a complete depletion state, thereby reducing the leak current.

In view of the foregoing background, it is important to set the width of the fin FA in the memory cell portion A wider (larger) than that of the fin FB in the logic portion B beforehand.

Figure 13:
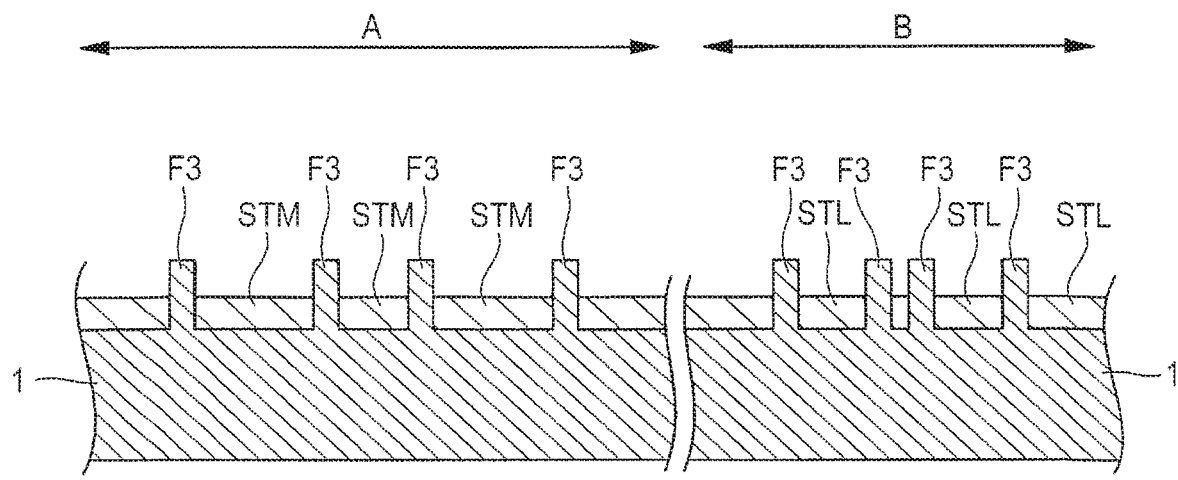
FIG. 13 is a cross-sectional view of a main part in a manufacturing step for the semiconductor device in the one embodiment.

Now, the manufacturing steps of the fin FA in the memory cell portion A and the fin FB in the logic portion B will be described with reference to FIGS. 13 to 15.

Like the above-mentioned considered example, the processes from the provision step (step S1) of the semiconductor substrate to the fin formation step (step S6) are performed in sequence. Note that the line-thinning step for the hard mask film 5b in the hard-mask-film formation step (step S4) is not performed. That is, as shown in FIG. 13, fins F3 with an equal width are formed in the memory cell portion A and the logic portion B. The width of each fin F3 is, for example, approximately 30 nm. The fins F3 are exposed from the element isolation films STM and STL by approximately 50 nm.

Figure 14:
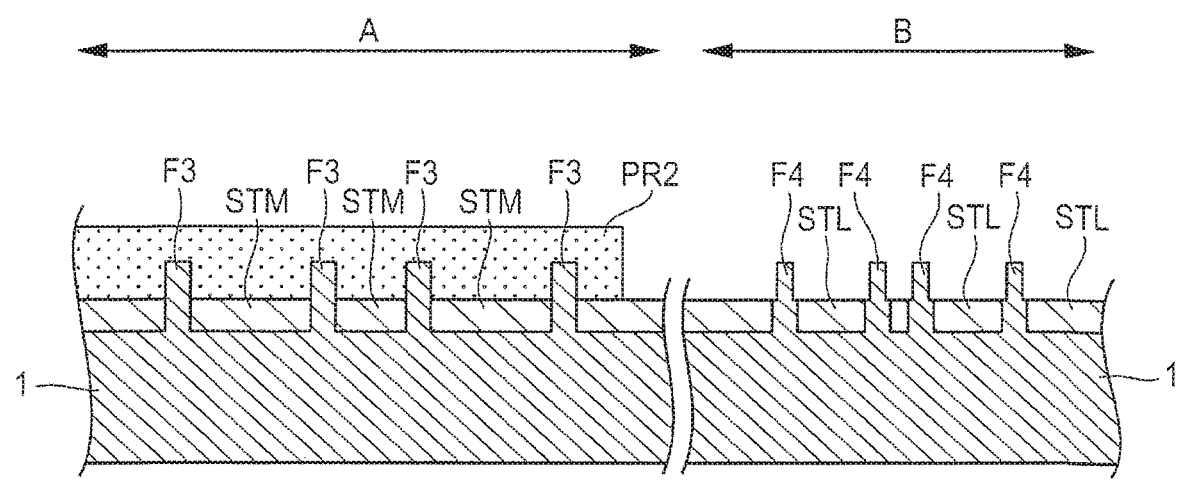
FIG. 14 is a cross-sectional view of a main part in another manufacturing step for the semiconductor device, following the step shown in FIG. 13.

Then, as shown in FIG. 14, a line-thinning step (step S7) of the fins is carried out. Isotropic etching is applied to the fins F3 made of silicon in the logic portion B by using a photoresist film (mask film) PR2 covering the memory cell portion A and exposing the logic portion B as a mask. The above-mentioned fins F3 in the logic portion B are selectively thinned, so that fins F4 are formed in the logic portion B. The fin F4 has, for example, a width of approximately 10 to 15 nm and a height of approximately 35 to 40 nm. The isotropic etching in use is, for example, dry etching using a mixed gas of $CF_4$ and $O_2$. After forming the fins F4, the photoresist film PR2 is removed. Subsequently, parts of the fins F4 in the logic portion B and the fins in the memory cell portion A may be covered with a mask (not shown) (made of, for example, a photoresist film), and the above-mentioned isotropic etching may be applied to the exposed parts of the fins F4, thereby producing narrower fins. Furthermore, these steps are repeated to enable the formation of two or more kinds of fins with different widths in the logic portion B.

Figure 15:
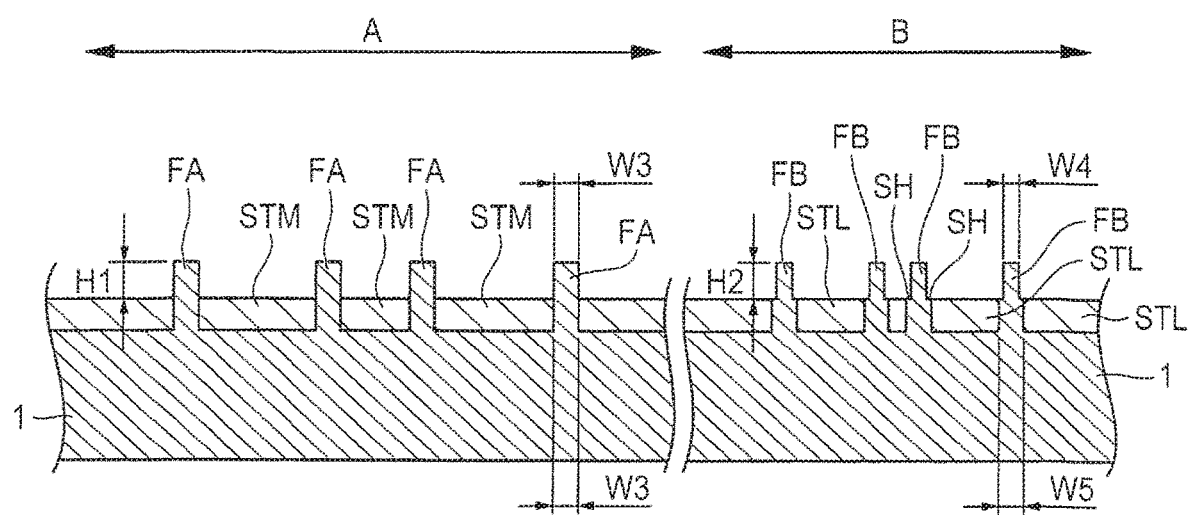
FIG. 15 is a cross-sectional view of a main part in another manufacturing step for the semiconductor device, following the step shown in FIG. 14.

Then, after removing the photoresist film PR2, as shown in FIG. 15, the semiconductor substrate 1 having the fins FA in the memory cell portion A and the fins FB in the logic portion B can be provided. In the memory portion A, the width of a part of each fin FA exposed from the element isolation film STM is substantially equal to that of a part of the fin FA embedded in the element isolation film STM. Here, such a width W3 is approximately 30 nm. A height H1 of the part of the fin FA exposed from the element isolation film STM is approximately 50 nm. In the logic portion B, a width W4 of a part of each fin FB exposed from the element isolation film STL is approximately 10 to 15 nm, and a width W5 of a part of the fin FB embedded in the element isolation film STL is approximately 30 nm. A height H2 of the part of the fin FB exposed from the element isolation film STL is approximately 35 to 40 nm. That is, the width W5 of the part of the fin FB embedded in the element isolation film STL is wider than the width W4 of the part of the fin FB exposed from the element isolation film STL, whereby a shoulder portion SH of a part of the fin FB embedded in the element isolation film STL is exposed from the element isolation film STL.

In this way, the isotropic etching is applied to the fins made of silicon to make the width of each fin narrower, which can reduce variations in the etching amount and in the fin width across the plane of the semiconductor wafer, thereby producing a stable fin formation method. The processing accuracy of the fins can be improved to achieve the miniaturization and highly integrated configuration of the logic portion B. The dry etching of silicon has a lower etching rate than wet etching of a silicon oxide film, resulting in better controllability of the etching amount. The controllability of etching is high because of the dry etching, thereby making it possible to reduce variations in the etched state across the plane.

Next, the manufacture of the memory cell MC and the transistor Tr will be described with reference to FIGS. 16 to 28. FIGS. 16 to 25, FIG. 27, and FIG. 28 illustrate cross-sectional views of the memory cell portions A1, A2, and A3 shown in FIG. 11 and cross-sectional view of the logic portions B1 and B2 shown in FIG. 12. FIG. 26 shows the cross-sectional views of the memory cell portion A4 and the logic portion B3.

Figure 16:
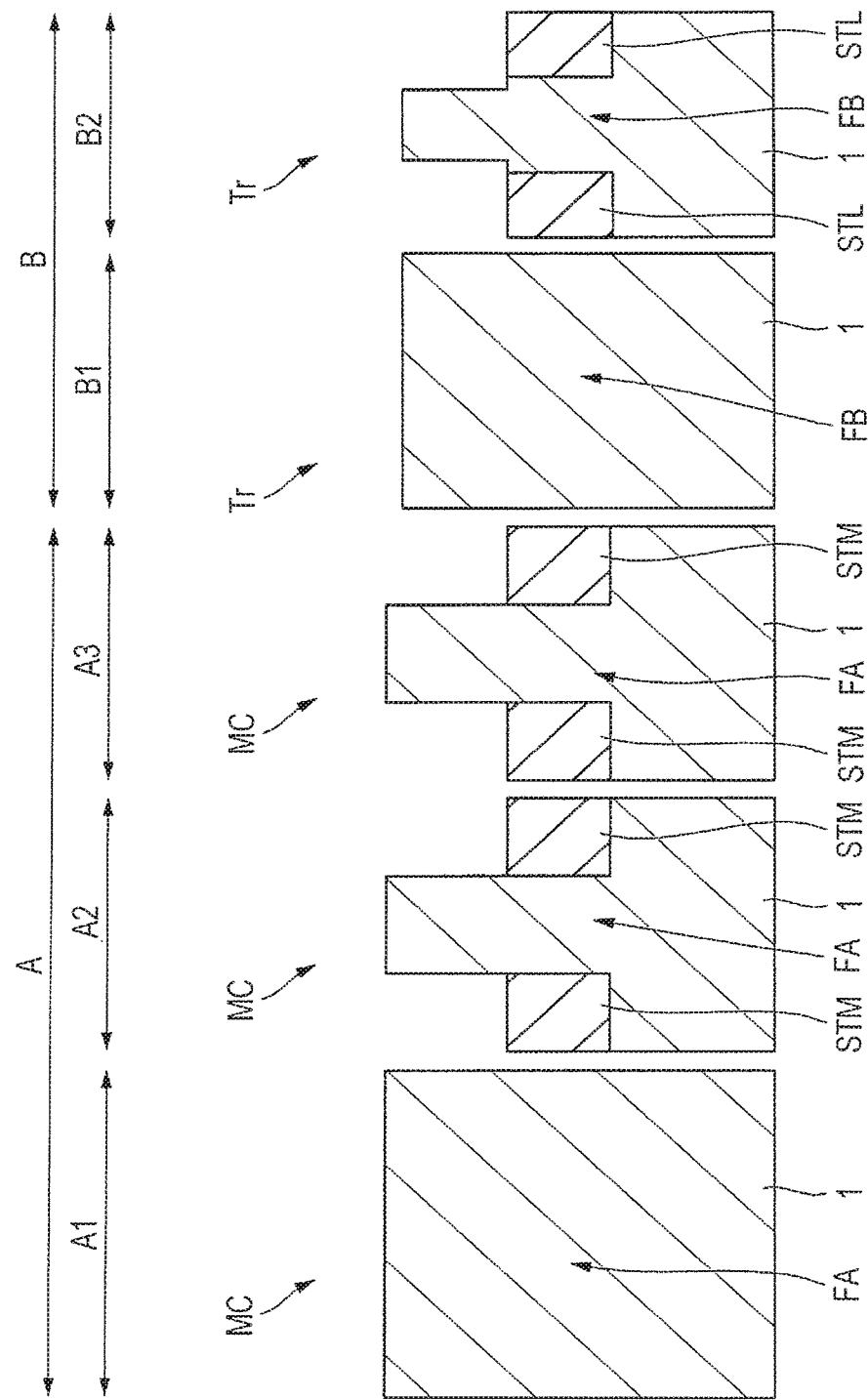
FIG. 16 is a cross sectional view of a main part of the semiconductor device in FIG. 15.

FIG. 16 illustrates the cross-sectional view of the memory cell portions A1, A2, and A3 and the logic portions B1 and B2, with the fins FA and FB shown in FIG. 15.

Figure 17:
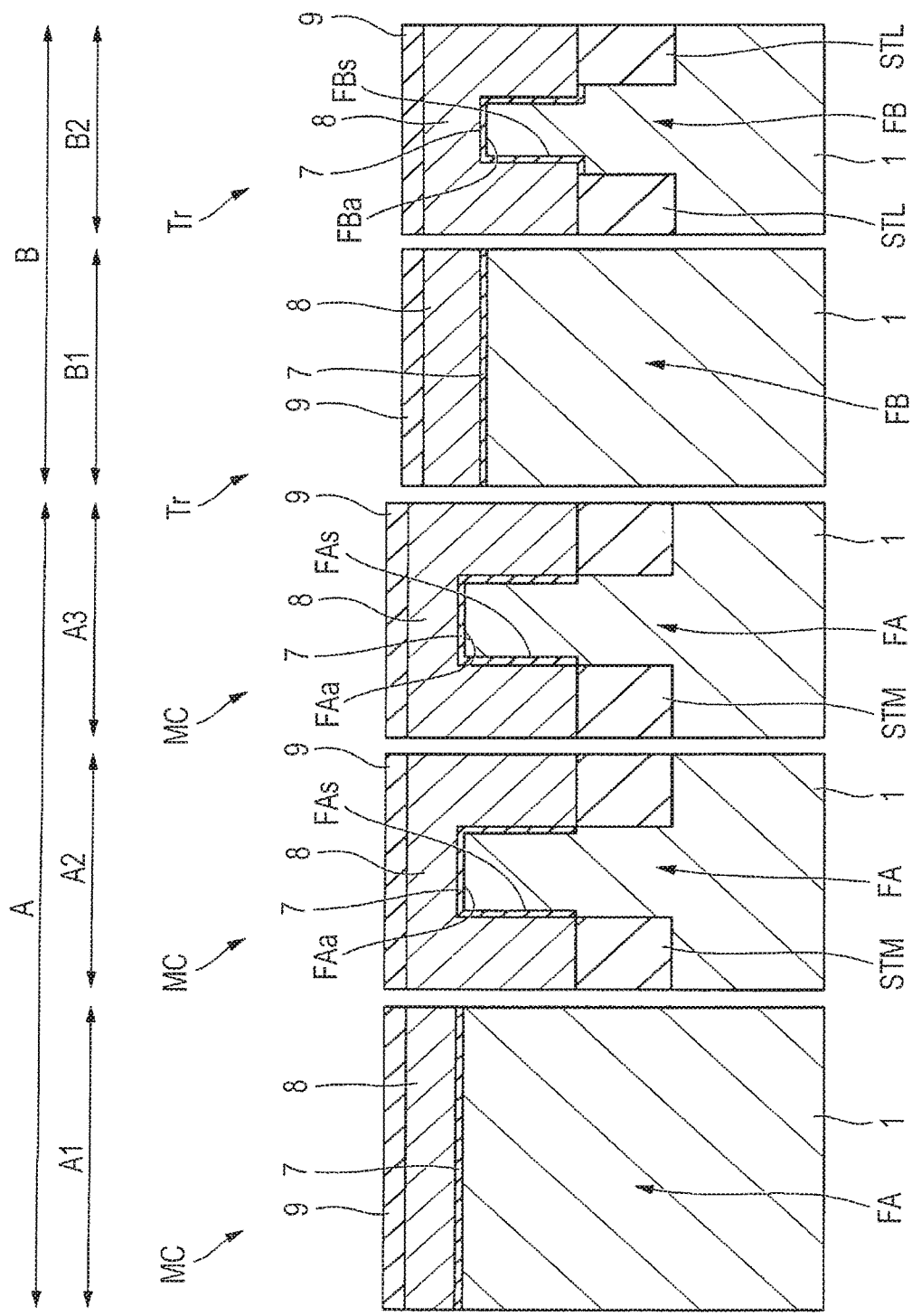
FIG. 17 is a cross-sectional view of a main part in another manufacturing step for the semiconductor device, following the step shown in FIG. 16.

FIG. 17 shows a formation step (step S8) of an insulating film 7, a conductive film 8, and an insulating film 9. First, the insulating film 7 is formed over the main surfaces FAa and FBa and side surfaces FAs and FBs of the fins FA and FB. The insulating film 7 is formed by thermally oxidizing the main surfaces FAa and FBa and side surfaces FAs and FBs of the fins FA and FB, thereby forming silicon oxide films of approximately 2 nm in thickness. Then, the conductive film 8 is deposited over the insulating film 7 to be positioned at a level higher than the height of each of the fins FA and FB, followed by a CMP process on the conductive film 8, thereby producing the conductive film 8 with a flat main surface. Then, the insulating film 9 is deposited over the main surface of the conductive film 8. The conductive film 8 is made of a polysilicon film (silicon film), while the insulating film 9 is made of a silicon nitride film. In the CMP step of the conductive film 8, it is important to leave the conductive film 8 over the main surfaces of the fins FA and FB. As will be described later, the insulating film 9 preferably has a thickness that is substantially the same as the height of the fin FA, but it is noted that FIG. 17 and other drawings show the insulating film 9 in a thinned state.

Figure 18:
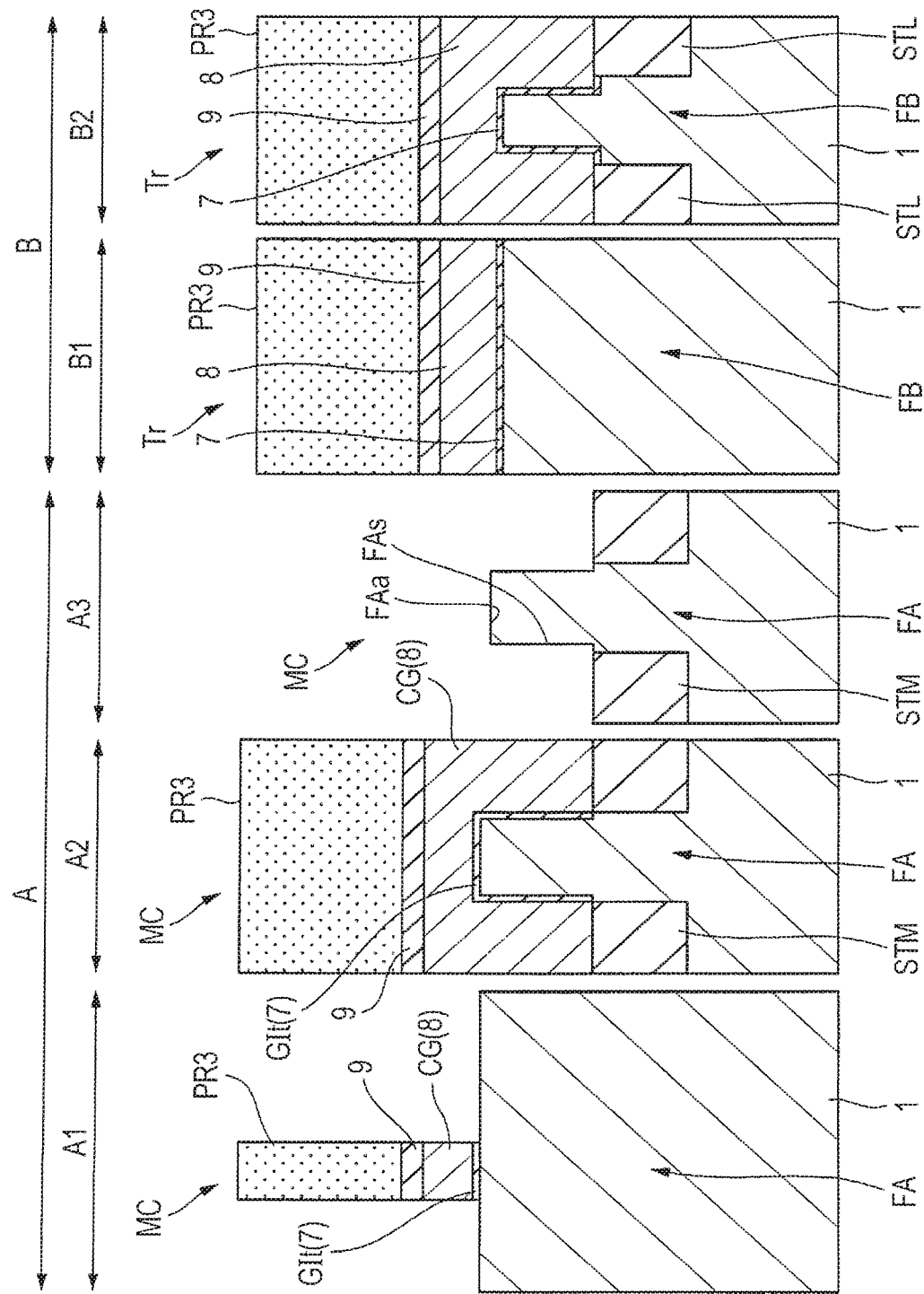
FIG. 18 is across-sectional view of a main part in another manufacturing step for the semiconductor device, following the step shown in FIG. 17.

FIG. 18 shows a formation step (step S9) of the control gate electrode CG. A photoresist film (mask film) PR3 is selectively formed over the insulating film 9. The photoresist film PR3 has a pattern that covers formation regions for the control gate electrodes CG and exposes other regions in the memory cell portion A. Furthermore, the photoresist film PR3 has a pattern covering the logic portion B. A dry etching process is applied to the insulating film 9 and the conductive film 8 to remove the regions of the insulating film 9 and conductive film 8 exposed from the photoresist film PR3, thereby forming the control gate electrodes CG. The insulating film 7 is processed by the dry etching process or the following cleaning process, whereby the gate insulating film GIt is formed under the control gate electrodes CG. In the memory cell portion A3, the insulating film 9, the conductive film 8, and the insulating film 7 are removed to expose the main surface FAa and side surfaces FAs of each fin FA. The photoresist film PR3 is removed after patterning the insulating film 9 or after patterning the insulating film 9 and the conductive film 8.

Figure 19:
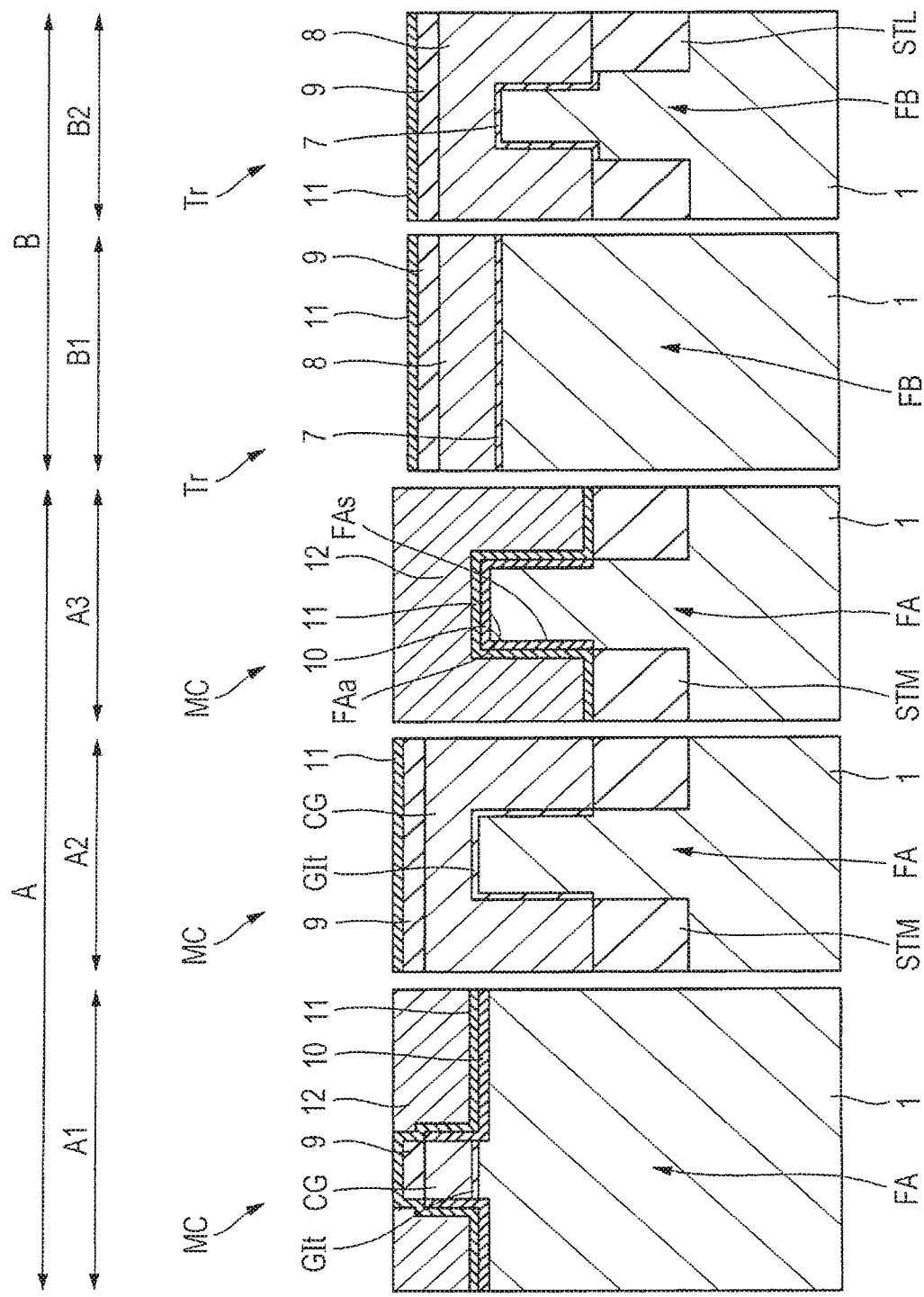
FIG. 19 is a cross-sectional view of a main part in another manufacturing step for the semiconductor device, following the step shown in FIG. 18.

FIG. 19 shows a formation step (step S10) of insulating films 10 and 11 and a conductive film 12. First, insulating films 10 and 11 are formed sequentially over the main surface FAa and side surfaces FAs of each fin FA exposed from the control gate electrode CG. The insulating film 10 is a silicon oxide film formed by thermally oxidizing the main surface FAa and side surfaces FAs of the fin FA. The insulating film 10 has a thickness of 5 to 6 nm, which is larger than that of the gate insulating film GIt. Then, the insulating film 11 has a laminated film that includes a silicon nitride film and a silicon oxynitride film formed over the silicon nitride film. The thickness of the silicon nitride film is 7 nm, and the thickness of the silicon oxynitride film is 9 nm. Note that the insulating film 11 may be a laminated film of a lower layer of HfSiO and an upper layer of AlO.

Then, a conductive film 12 is deposited over the insulating film 11. The conductive film 12 has such a thickness that is larger than each of the height of the laminated body of the control gate electrode CG and insulating film 9, and the height of the fin FA in the memory cell portion A3. The CMP process is applied to the conductive film 12 to expose the insulting film 11 located over the control gate electrode CG, whereby as shown in FIG. 19, the conductive film 12 is selectively formed in the regions exposed from the control gate electrodes CG in the memory cell portion A. After the CMP process, the conductive film 12 is left over the fin FA in the memory cell portion A3. Note that the conductive film 12 is made of a polysilicon film (silicon film). In the logic portion B, the conductive film 12 is removed to expose the insulating film 11.

Figure 20:
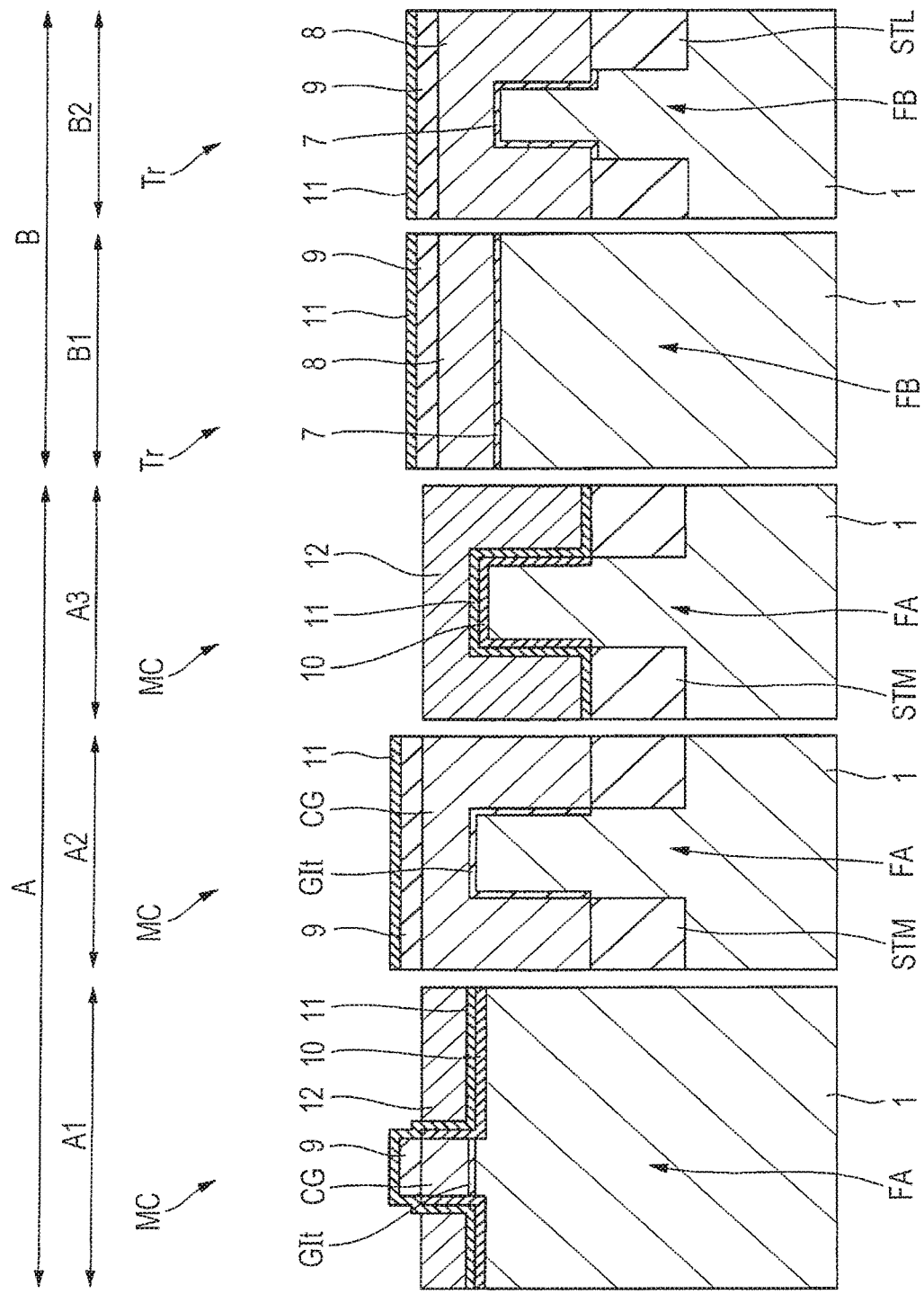
FIG. 20 is a cross-sectional view of a main part in another manufacturing step for the semiconductor device, following the step shown in FIG. 19.

FIG. 20 shows an etch-back step (step S11) of the conductive film 12. An etching process is applied to the conductive film 12 in the memory cell portion A to thereby lower the height of the main surface of the conductive film 12. After the etch-back process, the main surface of the conductive film 12 has substantially the same height as, for example, the main surface of the control gate electrode CG.

Figure 21:
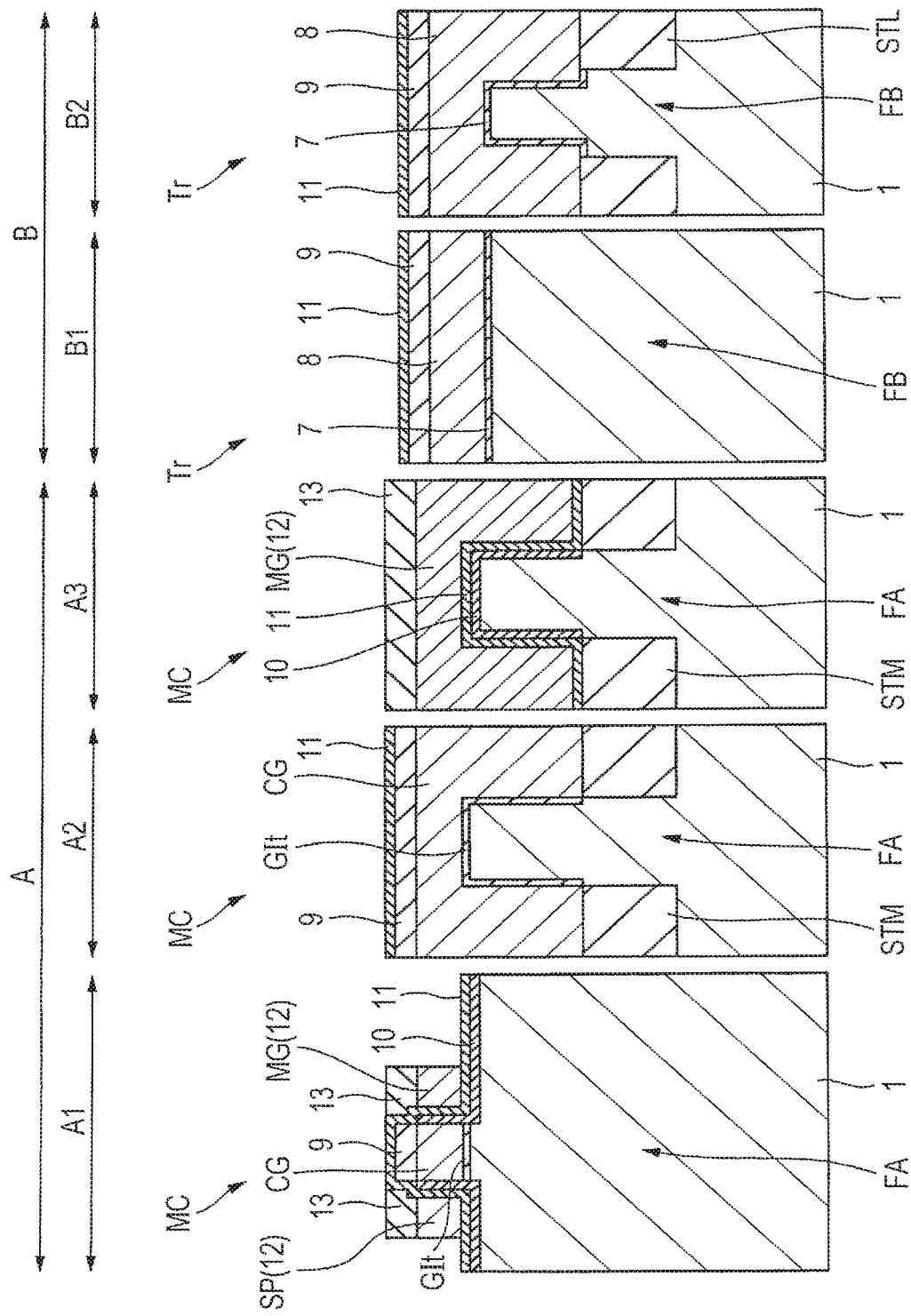
FIG. 21 is a cross-sectional view of a main part in another manufacturing step for the semiconductor device, following the step shown in FIG. 20.

FIG. 21 shows a formation step (step S12) of the control gate electrode CG. A silicon nitride film is deposited over the sidewalls of the insulating films 9 and 11 over the control gate electrode CG and over the conductive film 12, followed by anisotropic etching, thereby forming a mask film 13 over the sidewalls of the insulating films 9 and 11 on the control gate electrode CG. A part of the conductive film 12 exposed from the mask film 13 is removed by etching, whereby the memory gate electrode MG and a spacer SP are formed over the respective sidewalls of the control gate electrode CG via the insulating films 10 and 11. Note that although the spacer SP has the substantially same structure as the memory gate electrode MG, it is removed in a subsequent step. This is why the spacer is denoted by a different name.

Figure 22:
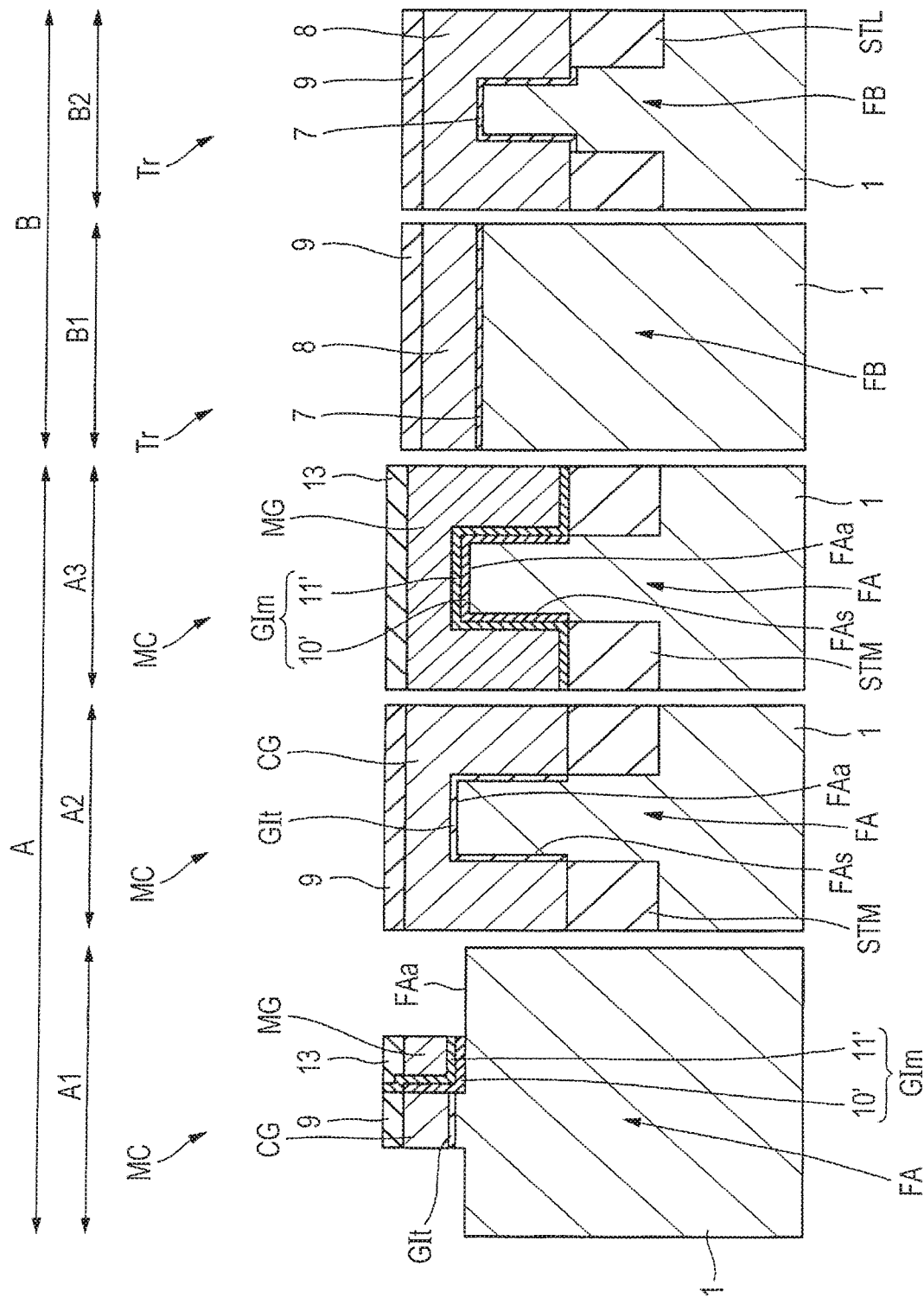
FIG. 22 is a cross-sectional view of a main part in another manufacturing step for the semiconductor device, following the step shown in FIG. 21.

FIG. 22 shows a step of removal of the spacer SP and formation of a gate insulating film GIm (step S13). First, the spacer SP and the mask film 13 over the spacer SP shown in FIG. 21 are removed, for example, by a wet etching process using a resist film (not shown) covering the memory gate electrode MG and exposing the spacer SP. Subsequently, parts of the insulating films 11 and 10 in the regions exposed from the memory gate electrode MG are removed, for example, by the wet etching process, so that insulating films 11' and 10' are selectively left under the memory gate electrode MG (i.e., between the memory gate electrode MG and the fin FA), and the gate insulating film GIm is formed. Note that the gate insulating films GIm are continuously formed not only between the main surface FAa of the fin FA and the memory gate electrode MG, but also between the control gate electrode CG and the memory gate electrode MG. The gate insulating film GIm shown in FIG. 22 is formed along the main surface FAa and side surfaces FAs of the fin FA.

Figure 23:
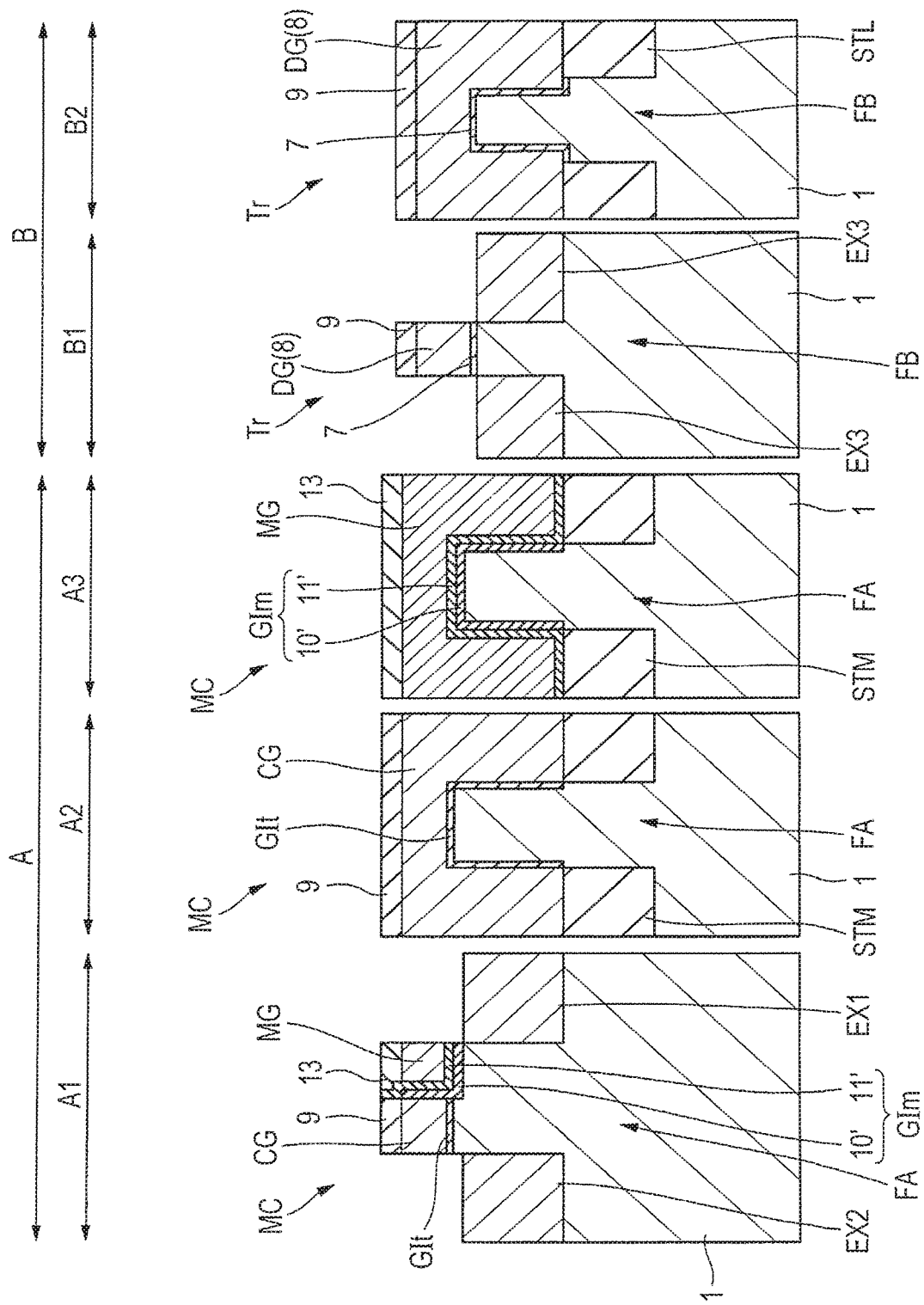
FIG. 23 is a cross-sectional view of a main part in another manufacturing step for the semiconductor device, following the step shown in FIG. 22.

FIG. 23 shows a formation step (step S14) of a dummy gate DG and the n$^-$-type semiconductor regions (impurity diffusion layers) EX1, EX2, and EX3. First, in the logic portion B, the insulating film 9 and the conductive film 8 are patterned to form the dummy gate DG. The insulating film 9 over the dummy gate DG and the insulting film 7 under the dummy gate DG have the same planar pattern as the dummy gate DG itself does.

Then, n-type impurities, such as arsenic (As) or phosphorus (P), are introduced into the fins FA and FB by ion implantation, so that n$^-$-type semiconductor regions EX1 and EX2 are formed in the fin FA, and n$^-$-type semiconductor regions EX3 are formed in the fin FB. The n$^-$-type semiconductor regions EX1 and EX2 are formed in self-alignment with the control gate electrode CG and the memory gate electrode MG. That is, the n-type impurities are implanted into the main surface and side surfaces of the fin FA exposed from the control gate electrode CG and the memory gate electrode MG, whereby the n$^-$-type semiconductor regions EX1 and EX2 are formed on both sides of the control gate electrode CG and the memory gate electrode MG to sandwich therebetween the control gate electrode CG and the memory gate electrode MG. Since impurities are diffused by a heat treatment after the ion implantation, the n$^-$-type semiconductor region EX1 partially overlaps with the memory gate electrode MG, while the n$^-$-type semiconductor region EX2 partially overlaps with the control gate electrode CG.

The n$^-$-type semiconductor regions EX3 are formed in self-alignment with the dummy gate DG. That is, n-type impurities are implanted into the main surface and side surfaces of the fin FB exposed from the dummy gate DG, whereby the n$^-$-type semiconductor regions EX3 are formed at both sides of the dummy gate DG to sandwich the dummy gate DG therebetween. Since impurities are diffused by a heat treatment after the ion implantation, the n$^-$-type semiconductor region EX3 partially overlaps with the dummy gate DG.

Figure 24:
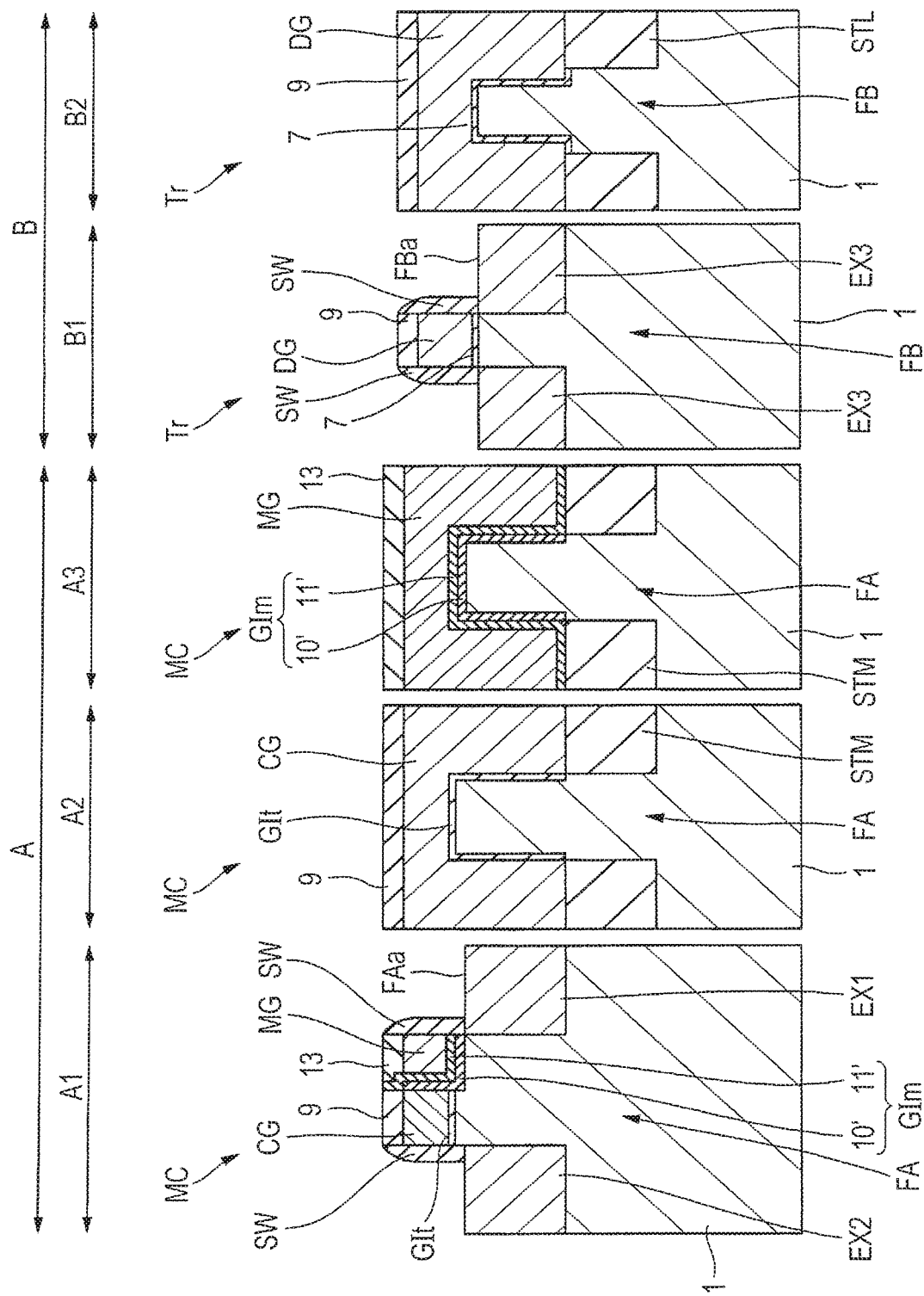
FIG. 24 is a cross-sectional view of a main part in another manufacturing step for the semiconductor device, following the step shown in FIG. 23.

FIG. 24 shows a formation step (step S15) of a sidewall spacer (sidewall, sidewall insulating film) SW. An insulating film, for example, of a silicon oxide film or silicon nitride film or a laminated film thereof, is deposited over the semiconductor substrate 1 to cover the main surfaces FAa and FBa of the fins FA and FB, followed by the anisotropic etching on the insulating film. In this way, in the memory cell portion A1, the sidewall spacers SW are formed not only over the sidewall of the control gate electrode CG and the insulating film 9, but also the sidewall of the memory gate electrode MG and the mask film 13. Here, the thickness of the insulating film 9 is substantially the same as the height of the fin FA, thereby enabling sufficient overetching. Thus, for example, the silicon oxide film or silicon nitride film for formation of the sidewall spacer SW never remains over the element isolation film STM enclosing the fin FA.

In the logic portion B1, the sidewall spacers SW are formed over the sidewalls of the dummy gate DG and the insulating film 9. By the above-mentioned anisotropic etching, the insulating films for formation of the sidewall spacer SW are removed from the memory cell portions A2 and A3 and the logic portion B2 to expose the insulating film 9 or mask film 13.

Figure 25:
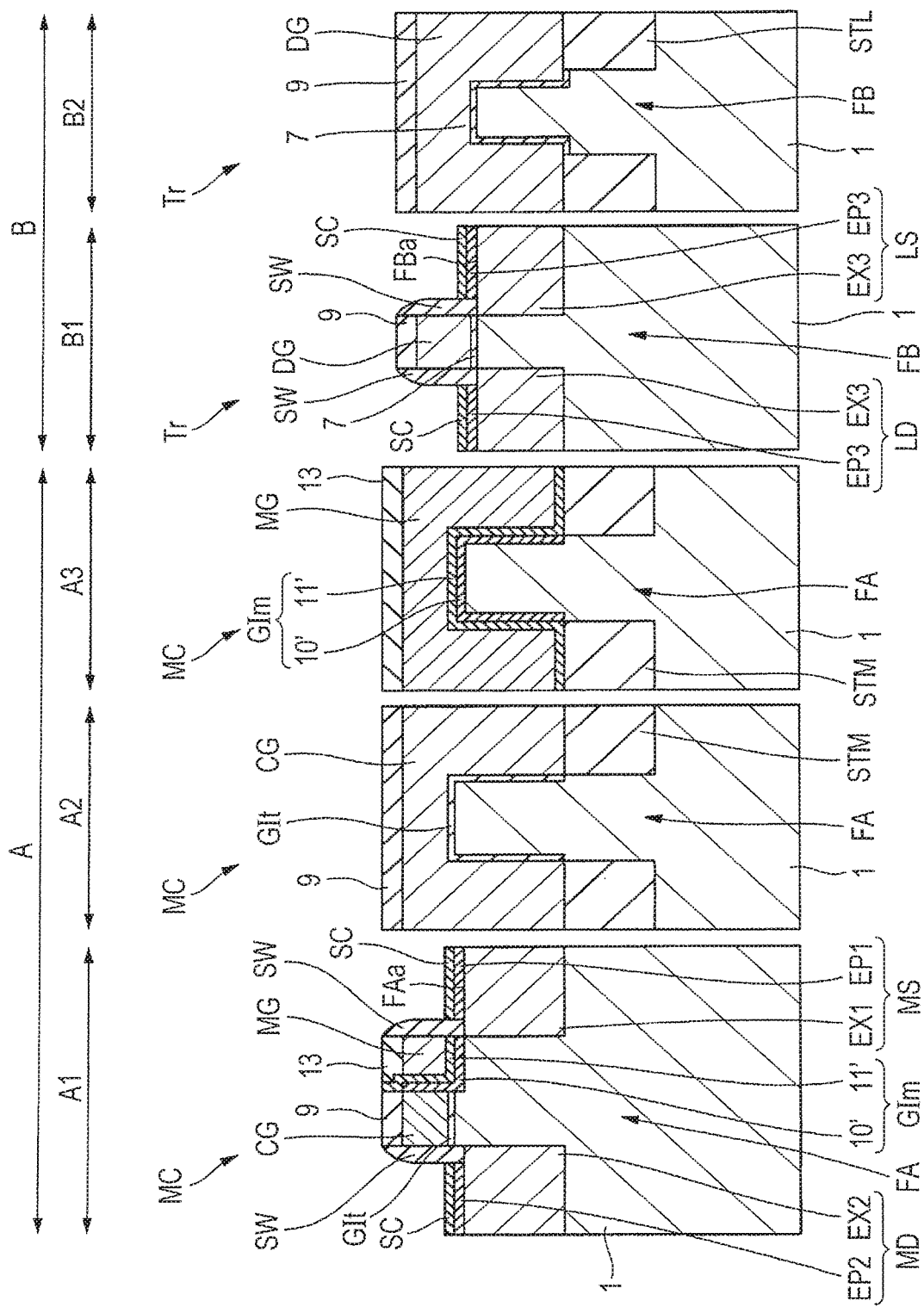
FIG. 25 is a cross-sectional view of a main part in another manufacturing step for the semiconductor device, following the step shown in FIG. 24.
Figure 26:
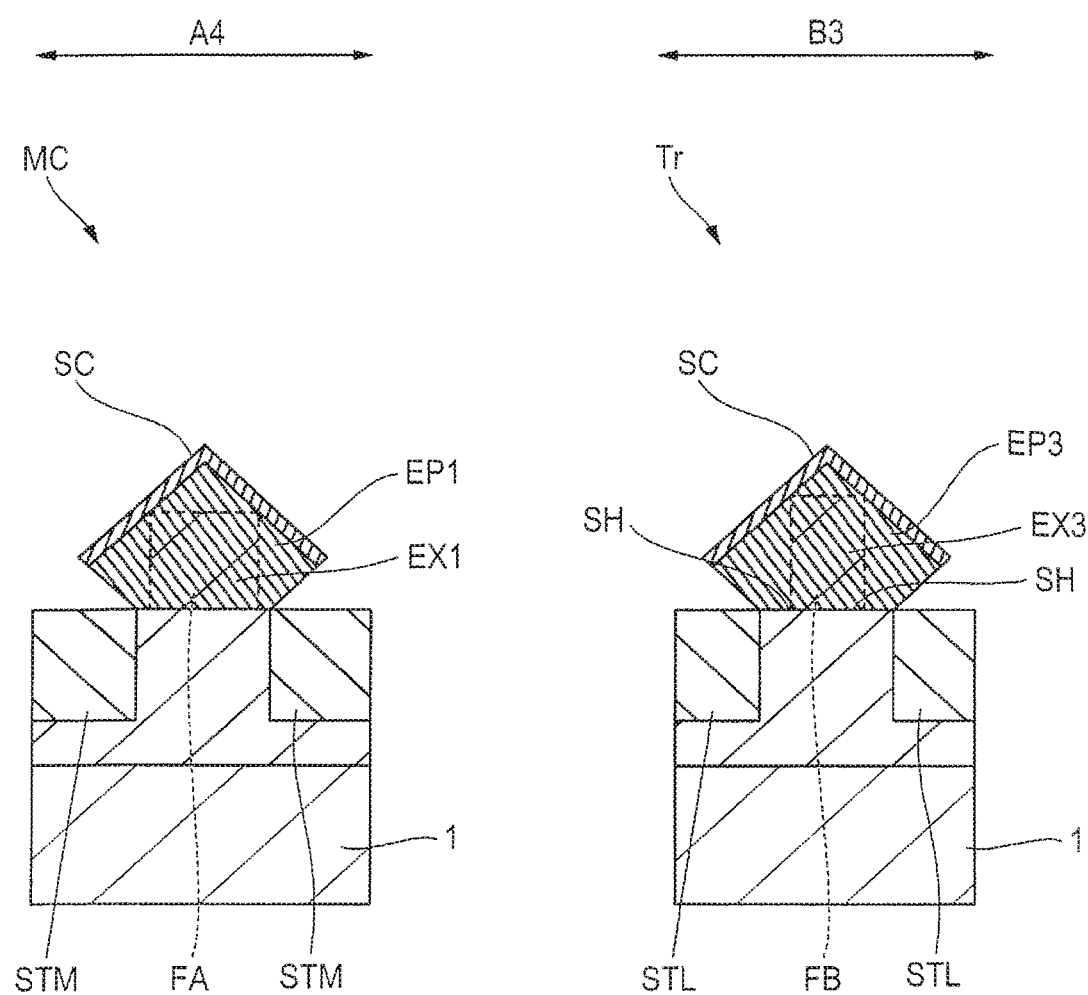
FIG. 26 is a cross-sectional view of a main part of the semiconductor device in the same step as that in FIG. 25 (but at a different position from that shown in FIG. 25)

Next, FIGS. 25 and 26 show a formation step (step S16) of the epilayers EP1, EP2, and EP3 and the silicide layer SC. In the memory cell portion A, the epilayers EP1 and EP2 are formed at the main surface FAa and side surfaces FAs of the fin FA exposed from the element isolation film STM, control gate electrode CG, memory gate electrode MG, and sidewall spacers SW. The epilayer EP3 is also formed in the same step at the main surface FBa and side surfaces FBs of the fin FB exposed from the element isolation film STL, dummy gate DG, and sidewall spacers SW. The epilayers EP1, EP2, and EP3 are formed by epitaxially growing $SiH_2Cl_2$ ($SiH_4$) using HCl, and $PH_3$ gas under an atmosphere at 100 Pa and 700° C. That is, the epilayers EP1, EP2, and EP3 are semiconductor layers doped with n-type impurities in a higher concentration than those in the n$^-$-type semiconductor regions EX1, EX2, or EX3. As shown in the logic portion B3 shown in FIG. 26, the shoulder portion SH of the part of the fin FB embedded in the element isolation film STL is exposed from the element isolation film STL in the logic portion B. Thus, epitaxial growth can also proceed out of the shoulder portion SH of the fin FB, thereby increasing the deposition amount of the epilayer EP3, compared to the case in which no shoulder portion SH is provided, thus decreasing a parasitic resistance of the source region LS and the drain region LD.

Note that when forming a p-type MISFET in the logic portion B, a p-type SiGe epilayer can be formed at the main surface FBa and side surfaces FBs of the fin FB exposed from the element isolation film STL, dummy gate DG, and sidewall spacers SW. The p-type SiGe epilayer is formed by epitaxially growing $SiH_2Cl_2$ ($SiH_4$) using $GeH_4$, HCl, and $B_2H_6$ gas under an atmosphere at 100 Pa and 700° C. The formation of the SiGe epilayer can reduce the parasitic resistances in the source region and drain region of the p-type MISFET, while improving the hall mobility by applying stress to the channel region, enabling a high-speed operation of the p-type MISFET.

Furthermore, as shown in FIGS. 25 and 26, a silicide layer SC is formed at the surfaces of the epilayers EP1, EP2, and EP3. The silicide layer SC can be preferably a cobalt silicide layer, a nickel silicide layer, or a platinum-added nickel silicide layer.

In this way, the source region MS of the memory cell MC is configured of the n⁻-type semiconductor region EX1 and the epilayer EP1 containing a higher concentration of n-type impurities than the n⁻-type semiconductor region EX1, while the drain region MD of the memory cell MC is configured of the n⁻-type semiconductor region EX2 and the epilayer EP2 containing a higher concentration of n-type impurities than the n⁻-type semiconductor region EX2. Furthermore, each of the source region LS and drain region LD of the transistor Tr in the logic portion B is configured of the n⁻-type semiconductor region EX3 and the epilayer EP3 containing a higher concentration of n-type impurities than the n⁻-type semiconductor region EX3.

Figure 27:
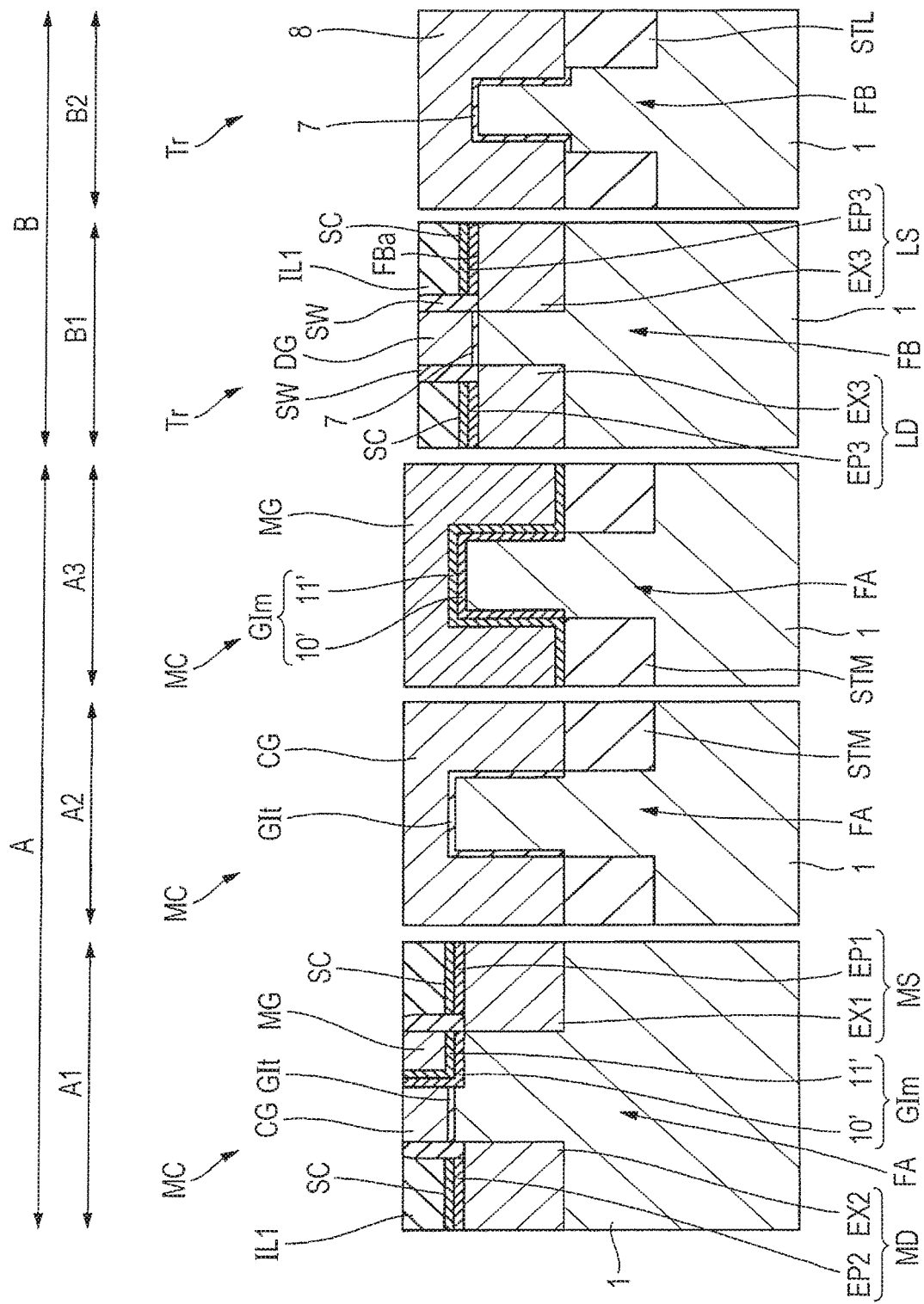
FIG. 27 is a cross-sectional view of a main part in another manufacturing step for the semiconductor device, following the step shown in FIG. 25.

FIG. 27 shows a formation step (step S17) of an interlayer insulating film IL1. The interlayer insulating film IL1 is formed (deposited) over the semiconductor substrate 1. The interlayer insulating film IL1 is a single film made of a silicon oxide film, or a laminated film including a silicon nitride film and a silicon oxide film formed on the silicon nitride film more thickly than the silicon nitride film. The interlayer insulating film IL1 can be formed, for example, using a CVD method. Then, polishing (polishing process) is performed on the upper surface of the interlayer insulating film IL1 by the CMP method and the like. As shown in FIG. 27, the respective upper surfaces of the control gate electrode CG, the memory gate electrode MG, and the dummy gate electrode DG are exposed. That is, in the polishing step, parts of the insulating film 9 and the mask film 13 formed over the control gate electrode CG, the memory gate electrode MG, and the dummy gate electrode DG are completely removed. Obviously, the sidewalls SW positioned over the sidewalls of the insulating film 9 and the mask film 13 are also partly removed.

Figure 28:
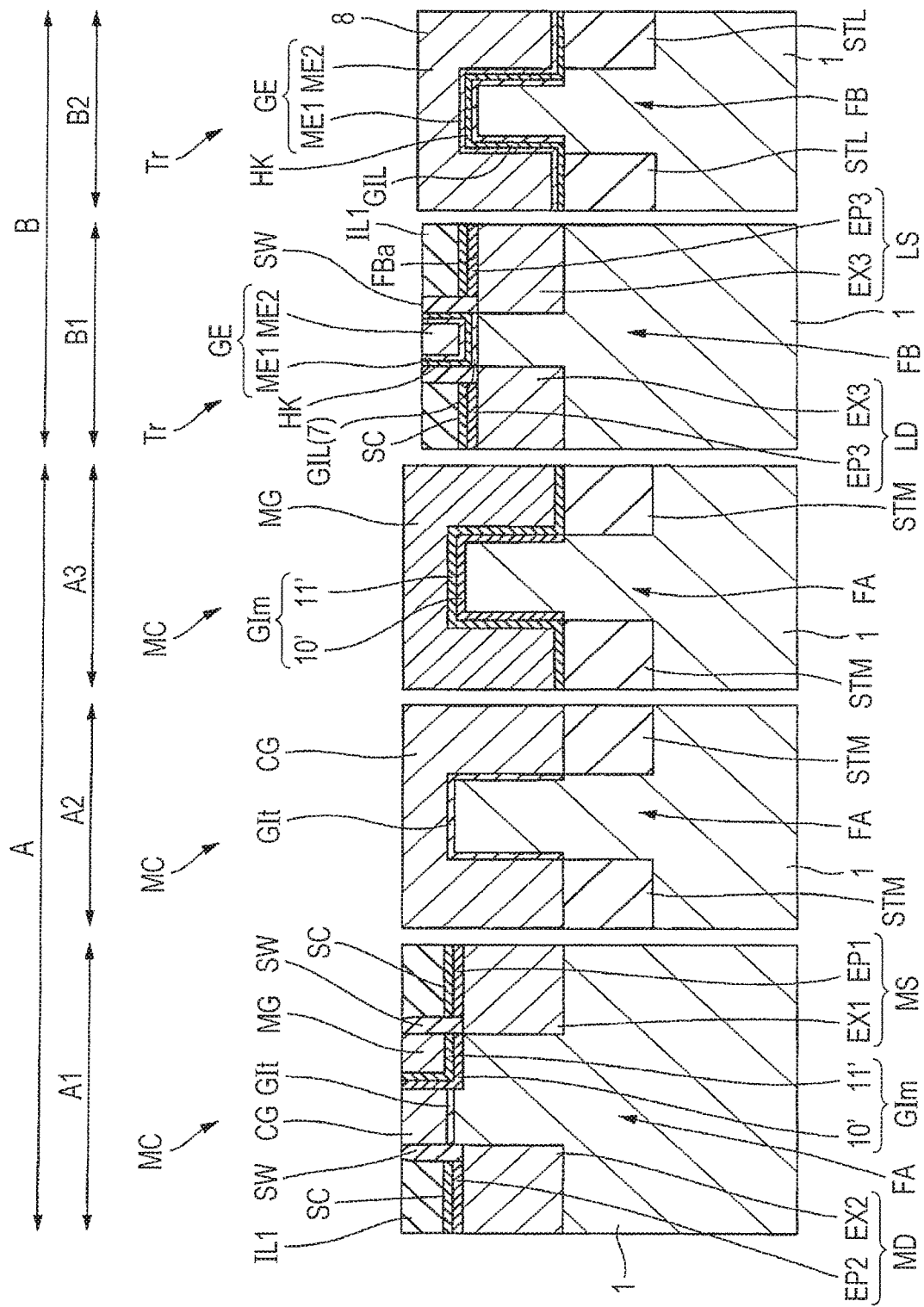
FIG. 28 is a cross-sectional view of a main part in another manufacturing step for the semiconductor device, following the step shown in FIG. 27.

FIG. 28 shows a formation step (step S18) of the gate electrode GE. First, a removal step of the dummy gate DG exposed as shown in FIG. 27 is performed. The removal of the dummy gate DG forms a groove in the interlayer insulating film IL1. The bottom part (bottom surface) of the groove is formed by the upper surface of the insulating film 7, and the sidewall (side surface) of the groove is formed by the side surface of the sidewall spacer SW (side surface in contact with the dummy gate DG before removal of the dummy gate DG). Then, as shown in FIG. 28, a formation step of an insulating film HK, a metal film ME1, and a metal film ME2 is carried out to sequentially deposit the insulating film HK, the metal film ME1, and the metal film ME2 over the semiconductor substrate 1, i.e., over the insulating film 7 inside (the bottom portion and sidewalls) of the groove. Further, a CMP process step is applied to the insulating film HK, the metal film ME1, and the metal film ME2. In this way, a laminated structure is selectively formed within the groove. The laminated structure includes the gate insulating film GIL made of the insulating film 7, the insulating film HK, the metal film ME1, and the metal film ME2, which are stacked on each other. Here, the insulating film HK is an insulating material film having a higher dielectric constant (relative permittivity) than that of silicon nitride, i.e., the so-called High-k film (high-dielectric-constant film).

The insulating film HK in use can be a metal oxide film, including a hafnium oxide film, a zirconium oxide film, an aluminum oxide film, a tantalum oxide film, or a lanthanum oxide film. The insulating film HK can be formed, for example, by an Atomic Layer Deposition (ALD) method or the CVD method.

For example, the metal film ME1 can be a titanium aluminum (TiAl) film, and the metal film ME2 can be an aluminum (Al) film. A titanium (Ti) film, a titanium nitride (TiN) film, or a laminated film thereof may be interposed between the metal films ME1 and ME2 to adjust a threshold voltage of the transistor Tr.

The insulating film HK is formed over the bottom part (bottom surface) and sidewalls of the groove, while the gate electrode GE has its bottom part (bottom surface) and sidewalls (side surfaces) adjacent to the insulating film HK. The insulating film GIL and the insulating film HK are interposed between the gate electrode GE and the fin FB of the semiconductor substrate 1. The insulating film HK is interposed between the gate electrode GE and the sidewall spacer SW. The gate insulating film GIL and the insulating film HK directly under the gate electrode GE serve as the gate insulating film of the transistor Tr. The insulating film HK is a high dielectric constant film and thus serves as a high-dielectric-constant gate insulating film.

Then, a formation step (step S19) of the interlayer insulating film IL2, the plug electrode PG, and the metal wiring MW will be described with reference to FIGS. 11 and 12. The interlayer insulating film IL2 is formed over the interlayer insulating film IL. The interlayer insulating film IL2 in use can be, for example, a silicon oxide-based insulating film mainly consisting of silicon oxide. After forming the interlayer insulating film IL2, the upper surface of the interlayer insulating film IL2 is polished by the CMP method to enhance the flatness of the upper surface of the interlayer insulating film IL2.

Then, contact holes (openings, through holes) CT are formed in the interlayer insulating films IL1 and IL2. The contact holes CT expose the surfaces of the silicide layers SC in the source region MS and drain region MD in the memory cell MC, and expose the surfaces of the silicide layers SC in the source region LS and drain region LD in the transistor Tr.

Then, a conductive plug PG made of, e.g., tungsten (W), is formed as a conductor for coupling in each contact hole CT. The plug electrode PG has a laminated structure including a barrier conductive film (e.g., a titanium film, a titanium nitride film, or a laminated film thereof), and a main conductive film (tungsten film) positioned on the barrier conductive film. The plug electrodes PG are electrically coupled with the source region MS and drain region MD in the memory cell MC, and with the source region LS and drain region LD in the transistor Tr.

Then, a metal wiring MW is formed over the interlayer insulating film IL2. The metal wiring MW has a laminated structure including a barrier conductive film (e.g., a titanium nitride film, a tantalum film, or a tantalum nitride film) and a main conductive film (copper film) formed on the barrier conductive film. For simplifying the drawing, FIGS. 11 and 12 illustrate the state in which the barrier conductive film and the main conductive film are integrated together to form the metal wiring MW. The same goes for the plug electrode PG.

The epilayers EP are formed in the source region MS and drain region MD in the memory cell MC as well as in the source region LS and drain region LD in the transistor Tr, which can prevent misalignment of the mask when forming the contact hole CT, while reducing a contact resistance between the plug electrode and the epilayer EP.

<Main Features and Effects>

Next, the main features and effects of this embodiment will be described.

In the manufacturing method for the semiconductor device in this embodiment, when forming the active regions with two or more kinds of fin widths, the fins with an equal width are formed in the respective first and second regions of the semiconductor substrate, and then, for example, the fins formed of silicon in the second region are selectively etched to fabricate another size of fins that have a narrower width in the second region than that of the fins in the first region. In this way, the dry etching process is applied to the fins made of silicon, so that the fins can be produced with higher processing accuracy, compared to the case of performing a line-thinning process by wet etching of a hard mask made of an insulating film for processing fins. Since variations in the processing can be reduced, the manufacturing yield can be improved.

The use of the isotropic etching for the above-mentioned etching process can also exhibit the effect of reducing any defect on the main surface or side surfaces of the fins with the narrower width formed in the second region. The use of the anisotropic dry etching would have the problem of causing etching damages (e.g., defects) on the side surface of the fins, or of attaching an etching product (polymer) onto the side surface of the fins when forming the fins with the equal width in the first and second regions. However, the etching damages and etching products can be removed by the isotropic etching with no damage.

The fin has its periphery covered with the element isolation film, and the part of the fin protruding from the element isolation film is subjected to the etching. To decrease the fin width, the fin is configured to have a first part with a wide width which has its periphery covered with the element isolation film, and a second part with a narrow width which is exposed from the element isolation film. The shoulder portion exposed from the upper surface of the element isolation film exists at the boundary between the first part and the second part. When the epitaxial growth proceeds on the main surface and side surfaces of the fin, the epitaxial growth also proceeds at the shoulder portion, so that the deposition of the epilayer formed around the fin can be promoted. Thus, the parasitic resistance of the source region and drain region in the MISFET with the epilayer formed thereat can be reduced.

The structure with the shoulder portion can reduce the leak current from the MISFET formed in the fin with the narrow width, while reducing the parasitic resistances in the source region and drain region of the MISFET. This is because the fin with the narrower width can be completely brought into the depletion state.

Modified Example

Figure 29:
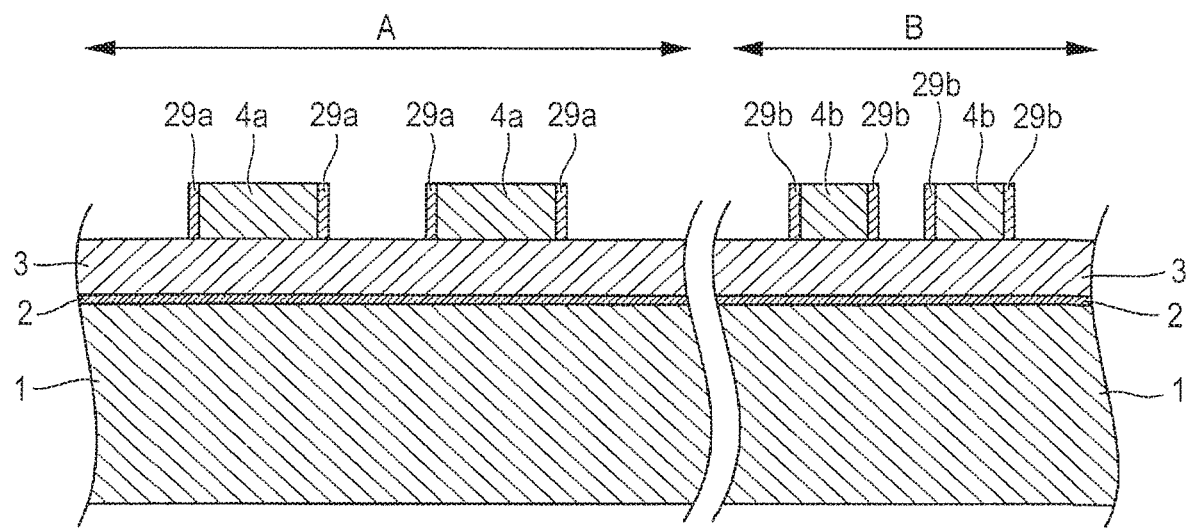
FIG. 29 is a cross-sectional view of a main part or a manufacturing step in a manufacturing method for a semiconductor device in a modified example.
Figure 30:
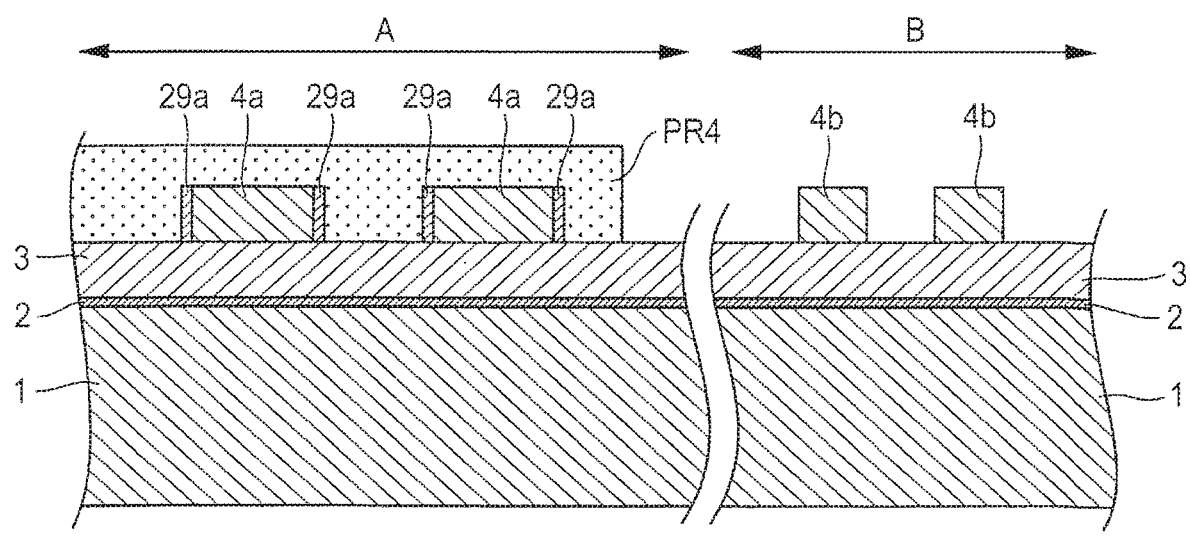
FIG. 30 is a cross-sectional view of a main part in another manufacturing step for the semiconductor device, following the step shown in FIG. 29.
Figure 31:
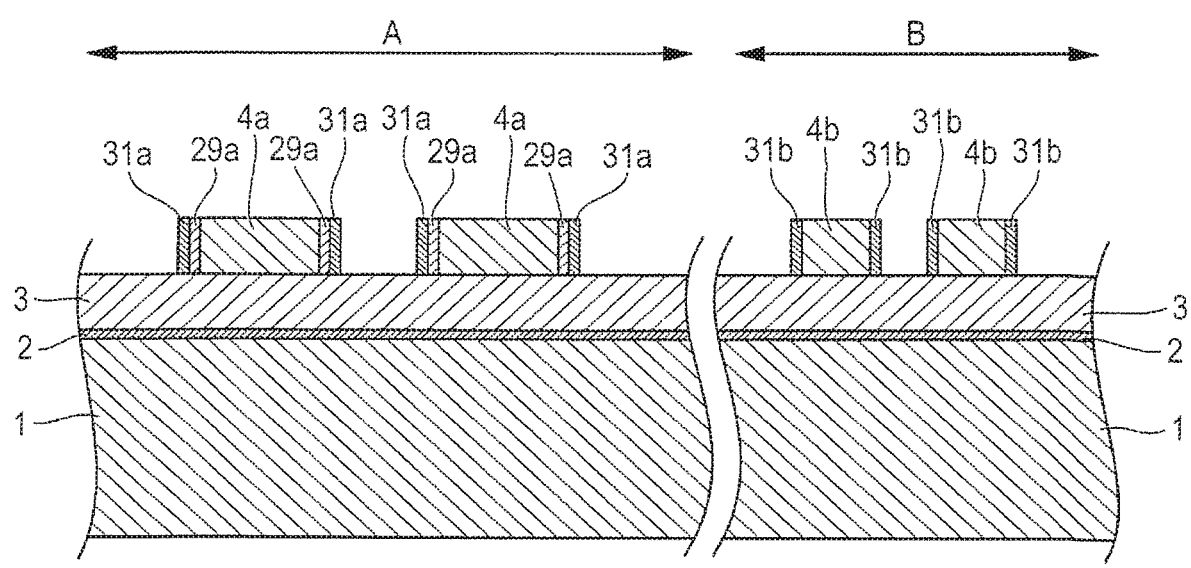
FIG. 31 is a cross-sectional view of a main part in another manufacturing step for the semiconductor device, following the step shown in FIG. 30.

A modified example is proposed to achieve the second improvement, and differs from the above-mentioned considered example in a hard-mask-film formation step (step S4). FIGS. 29 to 31 are cross-sectional views of main parts in the manufacturing steps for the semiconductor device in the modified example.

Like the above-mentioned considered example, the processes from the provision step (step S1) of the semiconductor substrate up to the mask-film formation step (step S3) will be performed in turn. Then, an insulating film made of a silicon oxide film is deposited over the main surface of the semiconductor substrate 1 to cover the upper surface and side surfaces of each of the mask films 4a and 4b, like the considered example. Then, as shown in FIG. 29, anisotropic etching is applied to the insulating film to form sidewall insulating films 29a and 29b over the sidewalls of the mask film 4a and 4b. Each sidewall insulating film 29a is formed in the memory cell portion A, while each sidewall insulating film 29b is formed in the logic portion B. Both sidewall insulating films 29a and 29b have an equal width.

Subsequently, as shown in FIG. 30, the sidewall insulating films 29b in the logic portion B are removed by using a photoresist film (mask film) PR4 that covers the memory cell portion A and exposes the logic portion B.

Then, as shown in FIG. 31, an insulating film made of a silicon oxide film is deposited over the main surface of the semiconductor substrate 1 to cover the mask films 4a and 4b and sidewall insulating films 29a. The insulating film is subjected to anisotropic etching to thereby form sidewall insulating films 31a over the sidewalls of the mask films 4a via the sidewall insulating films 29a, as well as sidewall insulating films 31b over the sidewalls of the mask films 4b. That is, the sidewall insulating films 29a and 31a formed over the sidewalls of the mask film 4a correspond to the hard mask film 5a in the considered example. The sidewall insulating films 31b formed on the sidewalls of the mask film 4b correspond to hard mask films 5b' subjected to line-thinning in the considered example. After forming the sidewall insulating films 29a, 31a, and 31b, steps S5 and S6 in the considered example and further steps to be performed after the step S8 in this embodiment are carried out, thereby completing the semiconductor device in the modified example.

In this way, the hard mask film 5a in the memory cell portion A is made of a laminated structure of the sidewall insulating films 29a and 31a, whereby the thickness of the insulating film for forming the sidewall insulating film 29a can be smaller than that of the insulating film 5 in the considered example. Thus, the MISFETs formed in the logic portion B can be miniaturized without filling an interval between the adjacent mask films 4b in the logic portion B.

Although the invention made by the inventors have been specifically described based on the embodiments, it is apparent that the invention is not limited to the embodiments, and that various modifications and changes can be made to those embodiments without departing from the scope of the invention.

What is claimed is:

1. A method for manufacturing a semiconductor device, comprising the steps of:
   (a) providing a semiconductor substrate with a main surface;
   (b) forming a first mask film in each of a first region and a second region of the main surface of the semiconductor substrate;
   (c) forming a second mask film over sidewalls of the first mask film in each of the first region and the second region;
   (d) removing the second mask film in the second region while leaving the second mask film in the first region;
   (e) forming a third mask film not only over sidewalls of the first mask film via the second mask film in the first region, but also directly on sidewalls of the first mask film in the second region;
   (f) after removing the first mask film, forming a first convex portion under the second mask film and the third mask film by providing first concave portions in the first region through etching of parts of the semiconductor substrate located outside the second mask film and the third mask film, the first convex portion having a first width, while forming a second convex portion under the third mask film by providing second concave portions in the second region through etching of parts of the semiconductor substrate located outside the third mask film, the second convex portion having a second width;

(g) forming a first gate electrode to stride across the first convex portion via a first insulating film in the first region; and (h) forming a second gate electrode to stride across the second convex portion via a second insulating film in the second region, wherein the second width is narrower than the first width.

2. The method for manufacturing a semiconductor device according to claim 1, wherein the first insulating film is formed by thermally oxidizing the first convex portion, wherein the second insulating film is formed by thermally oxidizing the second convex portion, and wherein a thickness of the first insulating film is larger than that of the second insulating film.

3. The method for manufacturing a semiconductor device according to claim 1, further comprising the step of:

(i) between the step (f) and the step (g), forming an element isolation film made of an insulating film to cover a periphery of each of the first convex portion and the second convex portion at respective lower parts of the first convex portion and the second convex portion.

4. The method for manufacturing a semiconductor device according to claim 3, wherein in the step (g), the first insulating film includes a silicon oxide film formed at a surface of the first convex portion and a silicon nitride film formed over the silicon oxide film.

5. The method for manufacturing a semiconductor device according to claim 1, wherein in the step (f), anisotropic etching is used as the etching of the semiconductor substrate.

* * * * *